United States Patent
Forrest et al.

(10) Patent No.: US 12,369,447 B2
(45) Date of Patent: Jul. 22, 2025

(54) ACCEPTOR BOTTOM LAYER FOR ORGANIC PHOTOVOLTAICS

(71) Applicant: The Regents of the University of Michigan, Ann Arbor, MI (US)

(72) Inventors: Stephen R. Forrest, Ann Arbor, MI (US); Kan Ding, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 139 days.

(21) Appl. No.: 16/937,128

(22) Filed: Jul. 23, 2020

(65) Prior Publication Data

US 2021/0028361 A1  Jan. 28, 2021

Related U.S. Application Data

(60) Provisional application No. 62/877,579, filed on Jul. 23, 2019, provisional application No. 62/940,981, filed on Nov. 27, 2019.

(51) Int. Cl.
*H10K 30/30* (2023.01)
*H10K 30/50* (2023.01)
*H10K 71/16* (2023.01)
*H10K 71/40* (2023.01)

(52) U.S. Cl.
CPC ......... *H10K 30/353* (2023.02); *H10K 71/164* (2023.02); *H10K 71/40* (2023.02); *H10K 30/50* (2023.02)

(58) Field of Classification Search
CPC ........................... H01L 51/4273; H10K 30/453
See application file for complete search history.

(56) References Cited

U.S. PATENT DOCUMENTS

| | | | |
|---|---|---|---|
| 8,993,998 B2 | 3/2015 | Yang | |
| 10,276,817 B2 | 4/2019 | Forrest | |
| 2005/0224905 A1 | 10/2005 | Forrest | |
| 2011/0083730 A1* | 4/2011 | Fichou | H10K 30/82 428/323 |
| 2012/0112170 A1* | 5/2012 | Jen | C08G 61/12 257/E51.026 |
| 2014/0116511 A1* | 5/2014 | Lee | H10K 71/40 252/500 |
| 2015/0311444 A9 | 10/2015 | Barr | |

(Continued)

FOREIGN PATENT DOCUMENTS

WO  2015116770  8/2015

OTHER PUBLICATIONS

Kato et al, "Organic Light-Emitting Diodes with a Nanostructured Fullerene Layer at the Interface between Alq3 and TPD Layers," 2003, Jpn. J. Appl. Phys. 42, p. 2526. (Year: 2003).*

(Continued)

*Primary Examiner* — Robert A Vetere
(74) *Attorney, Agent, or Firm* — Riverside Law LLP

(57) ABSTRACT

An organic photovoltaic device comprises an anode and a cathode, an active layer positioned between the anode and the cathode, comprising a first donor material and a first acceptor material in a first ratio, and an interface layer positioned between the anode and the cathode, comprising a second donor material and a second acceptor material in a second ratio. A method of fabricating an organic photovoltaic device and an organic photovoltaic device produced with the disclosed methods are also disclosed herein.

15 Claims, 18 Drawing Sheets

(56) References Cited

U.S. PATENT DOCUMENTS

| | | | |
|---|---|---|---|
| 2015/0349283 A1* | 12/2015 | Forrest | H01L 51/0056 257/40 |
| 2016/0204367 A1 | 7/2016 | Forrest | |
| 2016/0254101 A1* | 9/2016 | Forrest | H10K 30/211 136/256 |

OTHER PUBLICATIONS

Y. Lin, Y. Li and X. Zhan, Small molecule semiconductors for high-efficiency organic photovoltaics, Chem. Soc. Rev. 41, 4245 (2012).

A. Mishra and P. Bäuerle, Small molecule organic semiconductors on the move: Promises for future solar energy technology, Angew. Chem. Int. Ed. 51, 2020 (2012).

Y. Cui, H. Yao, J. Zhang, T. Zhang, Y. Wang, L. Hong, K. Xian, B. Xu, S. Zhang, J. Peng, Z. Wei, F. Gao and J. Hou, Over 16% efficiency organic photovoltaic cells enabled by a chlorinated acceptor with increased open-circuit voltages, Nat. Commun. 10, 2515 (2019).

Bässler, H. Charge transport in disordered organic photoconductors. Phys. Status Solidi B 175, 15-56 (1993).

Y. L. Lin, M. A. Fusella and B. P. Rand, The impact of local morphology on organic donor/acceptor charge transfer states, Adv. Energy Mater. 8, 1702816 (2018).

Liu, X., Ding, K., Panda, A. & Forrest, S. R. Charge transfer states in dilute donor-acceptor blend organic heterojunctions. ACS Nano 10, 7619-7626 (2016).

K. Ding, X. Liu and S. R. Forrest, Charge transfer and collection in dilute organic donor—acceptor heterojunction blends, Nano Lett. 18, 3180 (2018).

Z. Guan, H.-W. Li, Y. Cheng, Q. Yang, M.-F. Lo, T.-W. Ng, S.-W. Tsang and C.-S. Lee, Charge-transfer state energy and its relationship with open-circuit voltage in an organic photovoltaic device, J. Phys. Chem. C 120, 14059 (2016).

J. Meyer, S. Hamwi, M. Kröger, W. Kowalsky, T. Riedl and A. Kahn, Transition metal oxides for organic electronics: Energetics, device physics and applications, Adv. Mater. 24, 5408 (2012).

D. Y. Kim, J. Subbiah, G. Sarasqueta, F. So, H. Ding, Irfan and Y. Gao, The effect of molybdenum oxide interlayer on organic photovoltaic cells, Appl. Phys. Lett. 95, 093304 (2009).

M. Kröger, S. Hamwi, J. Meyer, T. Riedl, W. Kowalsky and A. Kahn, Role of the deep-lying electronic states of moo3 in the enhancement of hole-injection in organic thin films, Appl. Phys. Lett. 95, 123301 (2009).

J.-P. Yang, W.-Q. Wang, L.-W. Cheng, Y.-Q. Li, J.-X. Tang, S. Kera, N. Ueno and X.-h. Zeng, Mechanism for doping induced p type c60using thermally evaporated molybdenum trioxide (moo3) as a dopant, J. Phys. Condens. Matter 28, 185502 (2016).

C. Wang, I. Irfan, X. Liu and Y. Gao, Role of molybdenum oxide for organic electronics: Surface analytical studies, J. Vac. Sci. Technol. 32, 040801 (2014).

Irfan, M. Zhang, H. Ding, C. W. Tang and Y. Gao, Strong interface p-doping and band bending in c60 on moox, Org. Electron. 12, 1588 (2011).

M. T. Greiner, M. G. Helander, W.-M. Tang, Z.-B. Wang, J. Qiu and Z.-H. Lu, Universal energy-level alignment of molecules on metal oxides, Nat. Mater. 11, 76 (2011).

M. A. Baldo and S. R. Forrest, Interface-limited injection in amorphous organic semiconductors, Phys. Rev. B 64, 085201 (2001).

Y. Guo and J. Robertson, Origin of the high work function and high conductivity of moo3, Appl. Phys. Lett. 105, 222110 (2014).

J. Yun, W. Jang, T. Lee, Y. Lee and A. Soon, Aligning the band structures of polymorphic molybdenum oxides and organic emitters in light-emitting diodes, Phys. Rev. Appl. 7, 024025 (2017).

K. Inzani, T. Grande, F. Vullum-Bruer and S. M. Selbach, A van der waals density functional study of moo3 and its oxygen vacancies, J. Phys. Chem. C 120, 8959 (2016).

D. O. Scanlon, G. W. Watson, D. J. Payne, G. R. Atkinson, R. G. Egdell and D. S. L. Law, Theoretical and experimental study of the electronic structures of moo3 and moo2, J. Phys. Chem. C 114, 4636 (2010).

S. Krishnakumar and C. S. Menon, Electrical and optical properties of molybdenum trioxide thin films, Bull. Mater. Sci. 16, 187 (1993).

S. K. Deb and J. A. Chopoorian, Optical properties and color-center formation in thin films of molybdenum trioxide, J. Appl. Phys. 37, 4818 (1966).

L. Firlej, A. Zahab, F. Brocard and P. Bernier, Electric conductivity in c70 thin films, Synth. Met. 70, 1373 (1995).

S. L. Ren, K. A. Wang, P. Zhou, Y. Wang, A. M. Rao, M. S. Meier, J. P. Selegue and P. C. Eklund, Dielectric function of solid c70 films, Appl. Phys. Lett. 61, 124 (1992).

C. Battaglia, X. Yin, M. Zheng, I. D. Sharp, T. Chen, S. McDonnell, A. Azcatl, C. Carraro, B. Ma, R. Maboudian, R. M. Wallace and A. Javey, Hole selective moox contact for silicon solar cells, Nano Lett. 14, 967 (2014).

H. Ding, H. Lin, B. Sadigh, F. Zhou, V. Ozoliņš and M. Asta, Computational investigation of electron small polarons in α-moo3, J. Phys. Chem. C 118, 15565 (2014).

N. B. Kotadiya, H. Lu, A. Mondal, Y. Ie, D. Andrienko, P. W. M. Blom and G.-J. A. H. Wetzelaer, Universal strategy for ohmic hole injection into organic semiconductors with high ionization energies, Nat. Mater. 17, 329 (2018).

* cited by examiner

ACCEPTOR BOTTOM LAYER FOR ORGANIC PHOTOVOLTAICS

CROSS-REFERENCE TO RELATED APPLICATIONS

This application claims priority to U.S. Provisional Patent Application No. 62/877,579, filed on Jul. 23, 2019, and U.S. Provisional Patent Application No. 62/940,981, filed on Nov. 27, 2019, both of which are incorporated herein by reference in their entirety.

STATEMENT REGARDING FEDERALLY SPONSORED RESEARCH OR DEVELOPMENT

This invention was made with government support under grant no. N00014-17-1-2211, awarded by the Department of the Navy, Office of Naval Research. The government has certain rights in the invention.

BACKGROUND OF THE INVENTION

Organic optoelectronic devices such as organic light emitting devices (OLED), organic transistors/phototransistors, organic photodetectors and organic photovoltaics (OPV) have been drawing attention from both academia and industry because of their potential advantages, including flexibility, light weight, semi-transparency, and low cost compared to inorganic cells. Using recently developed organic materials and device architectures, the power conversion efficiency (PCE) of OPVs now exceeds 16%. However, a comprehensive understanding of photogeneration is still lacking even in the most simple device structures—a process that is complicated by morphological and energetic disorder that leads to charge localization.

OPV devices are typically used to convert solar or ambient energy into electrical power, which can be used to drive any power consuming or storing device, equipment, or system. The power conversion efficiency (PCE) of an OPV device is defined as $P_{max}/P_{solar}$, where $P_{max}$ is the maximum power the OPV can generate, determined by finding the point on the I-V curve for which the product of the current and voltage is a maximum. $P_{solar}$ is the solar radiation power illuminated on the device. $P_{max}$ is determined by finding the point on the I-V curve for which the product of the current and voltage is a maximum. Similar to inorganic solar cells, $PCE=J_{sc} \times V_{oc} \times FF/P_o$, where $J_{sc}$ is the short-circuit current, $V_{oc}$ is the open-circuit voltage, FF is called the fill factor which indicates how "square" the I-V curve for an OPV appears, and $P_o$ is the input optical power. Among these three factors, $J_{sc}$ and FF are related to the recombination process within the device while $V_{oc}$ reflects all the energetic changes during the processes of light absorption, exciton dissociation and charge extraction.

Current studies of energy losses incurred during photogeneration have focused primarily on the role of charge transfer (CT) states in bulk heterojunction (BHJ) OPVs. However, CT states are not the only source of energy loss. The present disclosure describes how energy losses at the interface between the active BHJ and the anode buffer layer can be as large as 0.4 eV.

Molybdenum oxide ($MoO_x$) is a popular material used in OPV anode buffer layers (ABL). It was initially thought to be a hole transporting and electron blocking material, but later it was revealed that $MoO_x$ transports electrons to recombine with photogenerated holes extracted from the active layer. Due to its large electron affinity, $MoO_x$ rips electrons from HOMOs of organic molecules and forms an interface dipole, resulting in an increase in HOMO and LUMO energy levels of the organic molecules near the interface. This effect has been revealed for several organic materials as summarized in Meyer et al., "Transition Metal Oxides for Organic Electronics: Energetics, Device Physics and Applications". Adv. Mater., (2012), incorporated herein by reference.

In this context, the present disclosure identifies an energy loss mechanism on the organic/anode buffer layer interface and demonstrates an effective way to reduce it. Application of the disclosed methods can result in an increase of up to 40 mV in device open-circuit voltage and an increase of up to 6% in power conversion efficiency compared with conventional devices.

SUMMARY OF THE INVENTION

In one aspect, an organic photovoltaic device comprises an anode and a cathode, an active layer positioned between the anode and the cathode, comprising a first donor material and a first acceptor material in a first ratio, and an interface layer positioned between the anode and the cathode, comprising a second acceptor material. In one embodiment, the first donor material comprises DBP. In one embodiment, the first acceptor material comprises $C_{70}$. In one embodiment, the first and second donor materials are the same. In one embodiment, the first and second acceptor materials are the same. In one embodiment, the volumetric ratio of the first donor material to the first acceptor material in the active layer is between 1:4 and 1:10. In one embodiment, the volumetric ratio of the first donor material to the first acceptor material in the active layer is about 1:8. In one embodiment, the volumetric ratio of the second donor material to the second acceptor material is between 9:1 and 1:9.

In one embodiment, the interface layer has a thickness of between 1 nm and 10 nm. In one embodiment, the interface layer has a thickness of about 2 nm. In one embodiment, the anode comprises a transparent material. In one embodiment, the cathode comprises a transparent material. In one embodiment, the interface layer is positioned between the anode and the active layer. In one embodiment, the device further comprises an anode buffer layer positioned between the anode and the interface layer. In one embodiment, the device further comprises an exciton blocking/electron transport layer positioned between the cathode and the active layer.

In another aspect, a method of fabricating an organic photovoltaic device comprises providing a first electrode layer, depositing an interface layer comprising a first acceptor material over the first electrode layer, depositing an active layer comprising a second acceptor material and a second donor material in a second ratio over the interface layer, and positioning a second electrode layer over the active layer. In one embodiment, the interface layer and the active layer are deposited with vacuum thermal evaporation. In one embodiment, the first acceptor material and the second acceptor material are the same. In one embodiment, the first donor material and the second donor material are the same. In one embodiment, the first donor material is deposited at a constant rate and the first acceptor material is deposited at a variable rate. In one embodiment, the vacuum thermal evaporation chamber is held at a base pressure of $10^{-7}$ Torr.

In one embodiment, the layers are deposited at a rate of between 0.2 Å/s and 1.6 Å/s. In one embodiment, the first acceptor material comprises $C_{70}$. In one embodiment, the first donor material comprises DBP. In one embodiment, the method further comprises the step of depositing a second active layer comprising a third acceptor material and a third donor material in a third ratio over the interface layer. In one embodiment, the third acceptor material and the first acceptor material are the same. In one embodiment, the third donor material and the first donor material are the same. In one embodiment, the first electrode layer is an anode and the second electrode layer is a cathode.

In another aspect, the present disclosure includes an organic photovoltaic device produced with the methods disclosed herein.

BRIEF DESCRIPTION OF THE DRAWINGS

The foregoing purposes and features, as well as other purposes and features, will become apparent with reference to the description and accompanying figures below, which are included to provide an understanding of the disclosure and constitute a part of the specification, in which like numerals represent like elements, and in which.

DETAILED DESCRIPTION

Figure 1:
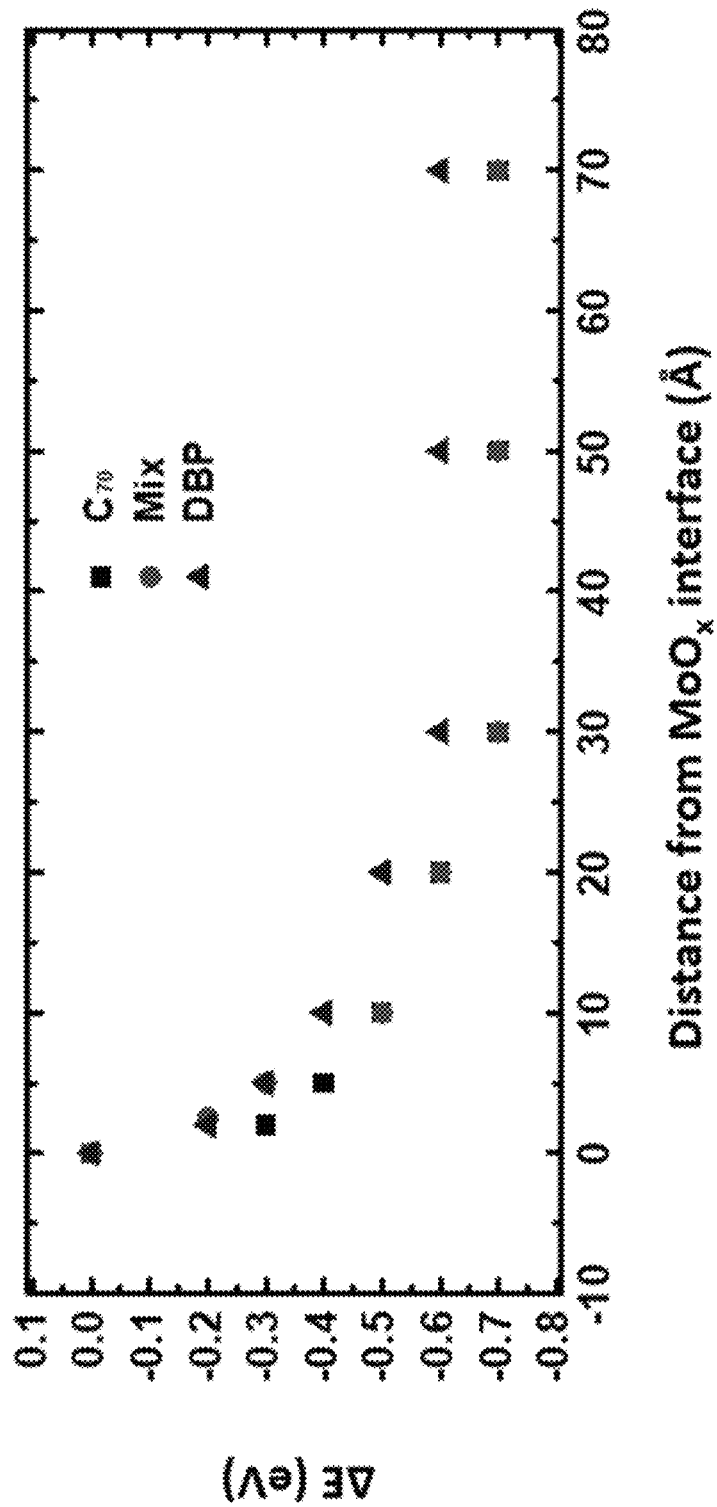
FIG. 1 is a graph of HOMO energy shifts over interface distance.

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the disclosure can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

As used herein, the terms "electrode" and "contact" may refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Examples of electrodes include anodes and cathodes, which may be used in a photosensitive optoelectronic device.

As used herein, the term "transparent" may refer to an electrode that permits at least 50% of the incident electromagnetic radiation in relevant wavelengths to be transmitted through it. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent.

As used herein, the term "semi-transparent" may refer to an electrode that permits some, but less than 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, the terms "donor" and "acceptor" refer to the relative positions of the highest occupied molecular orbital ("HOMO") and lowest unoccupied molecular orbital ("LUMO") energy levels of two contacting but different organic materials. It is energetically favorable, in the absence of an external bias, for electrons at a donor-acceptor junction to move into the acceptor material, and for holes to move into the donor material.

As used herein, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Because ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, the term "band gap" (Eg) of a polymer may refer to the energy difference between the HOMO and the LUMO. The band gap is typically reported in electron volts (eV). The band gap may be measured from the UV-vis spectroscopy or cyclic voltammetry. A "low band gap" polymer may refer to a polymer with a band gap below 2 eV, e.g., the polymer absorbs light with wavelengths longer than 620 nm.

As used herein, the term "excitation binding energy" (EB) may refer to the following formula: EB=(M$^+$+M$^-$)−(M*+M), where M$^+$ and M$^-$ are the total energy of a positively and negatively charged molecule, respectively; M* and M are the molecular energy at the first singlet state (S$_1$) and ground state, respectively. Excitation binding energy of acceptor or donor molecules affects the energy offset needed for efficient exciton dissociation. In certain examples, the escape yield of a hole increases as the HOMO offset increases. A decrease of exciton binding energy E$_B$ for the acceptor molecule leads to an increase of hole escape yield for the same HOMO offset between donor and acceptor molecules.

As used herein, power conversion efficiency ($\eta_p$) may be expressed as:

$$\eta_p = \frac{V_{OC} * FF * J_{SC}}{P_O} \qquad \text{Equation 1}$$

where $V_{OC}$ is the open circuit voltage, FF is the fill factor, $J_{SC}$ is the short circuit current, and $P_O$ is the input optical power.

One aspect of the present disclosure relates to use of an additional thin layer comprising a donor material and an acceptor material positioned between an anode buffer layer, for example an MoO$_x$ anode buffer layer, and an active BHJ layer. In one embodiment, the ABL comprises poly(3,4-ethylenedioxythiophene):polystyrene sulfonate (PEDOT:PSS). In one embodiment, the ABL comprises 1,4,5,8,9,11-Hexaazatriphenylenehexacarbonitrile (HAT-CN). In one embodiment, tetraphenyldibenzoperiflanthene (DBP) is used as the donor and C$_{70}$ is used as the acceptor. The HOMO energies of C$_{70}$, DBP and C$_{70}$/DBP 1:4 mixed films with various thickness deposited on a 10 nm-thick MoO$_x$ film were measured through ultraviolet photoelectron spectroscopy (UPS). The HOMO energy shifts ΔE from the MoO$_x$ interface for the films are shown in FIG. 1.

This energy shift exists within the energy shifting depth λ (≈3 nm for materials studied) from the MoO$_x$ interface. Molecules beyond λ to the MoO$_x$ interface exhibit the same HOMO energies as in the bulk. The HOMO energies of molecules in contact with MoO$_x$ shift up by 0.4-0.5 eV compared with those of the molecules in the bulk. Due to this energy uplift, the holes get extracted to the MoO$_x$ interface at a shallower energy compared with the hole energy of the donor molecules in the bulk. This results in a loss of the V$_{oc}$. This energy shift also brings the HOMO energy of acceptor molecules near the interface closer to the HOMO energy of donor molecules in the bulk, making it possible for holes to transfer onto the acceptor molecules and get collected at a deeper energy.

By independently controlling the donor/acceptor (D/A) ratio of the BHJ near the organic/MoO$_x$ interface and in the bulk, the interfacial energy losses are distinguished from those in the bulk. Furthermore, the open-circuit voltage (V$_{oc}$) can be varied over a range of 120 mV±10 independent of the short-circuit current (J$_{sc}$) and fill factor (FF). Kinetic Monte Carlo (k$_{MC}$) simulations are used to quantitatively evaluate the sources of the interfacial energy losses and their effect on device performance. The simulation suggests that the energy loss is due to a surface dipole arising from charge transfer between the organic and MoO$_x$. This surface dipole, whose existence is confirmed using ultraviolet photoelectron spectroscopy (UPS), also results in hole transport via acceptor molecules near the interface. Inserting a thin layer of an acceptor, for example C$_{70}$ between the BHJ and MoO$_x$ layer is found to reduce the energy loss by approximately 30% and increase V$_{OC}$ by 20 to 40 meV compared with conventional device architectures.

Figure 2A:
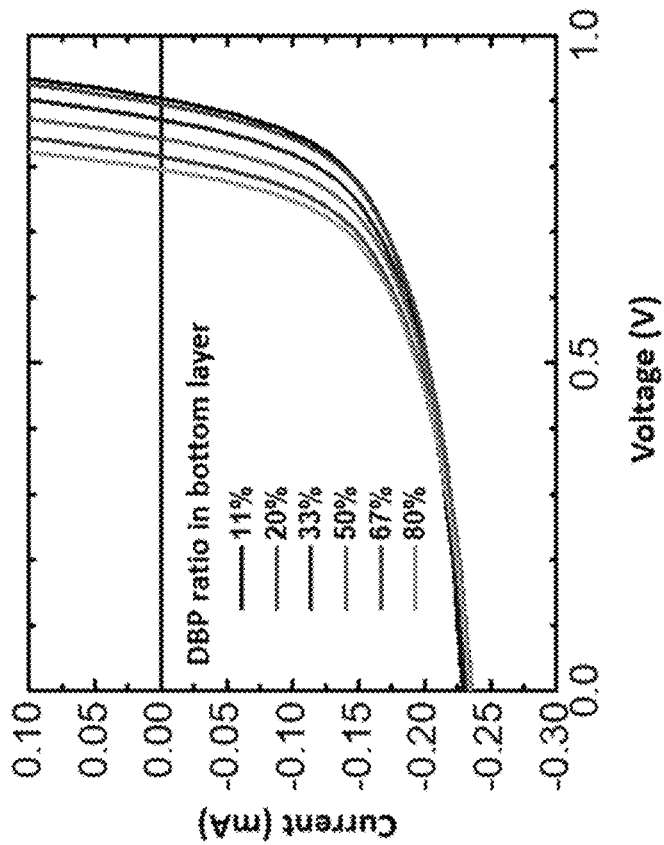
FIG. 2A is a diagram of an exemplary OPV device.
Figure 2B:
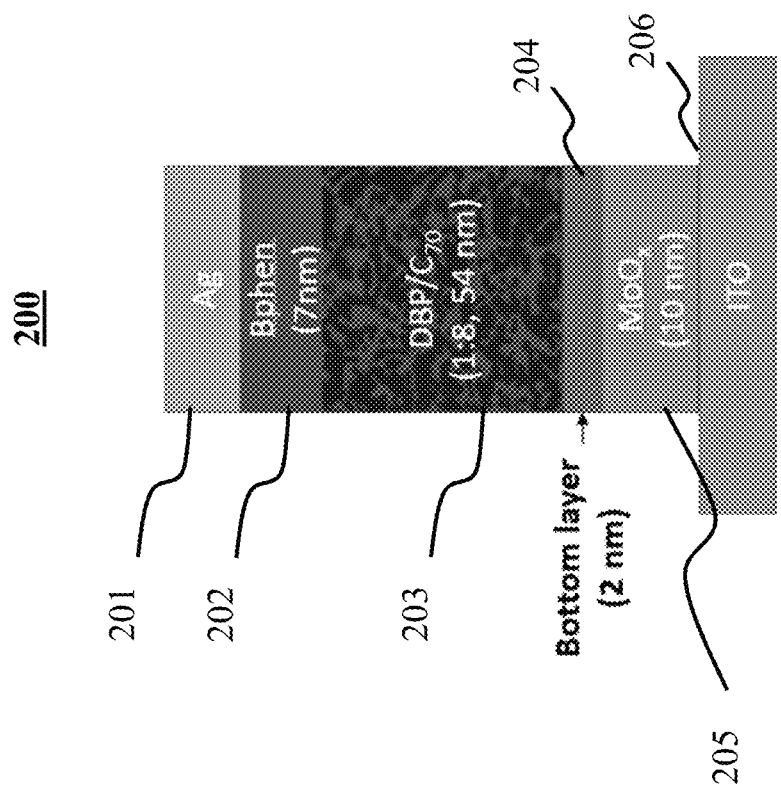
FIG. 2B is a graph of I-V curves for various donor/acceptor ratios.
Figure 2C:
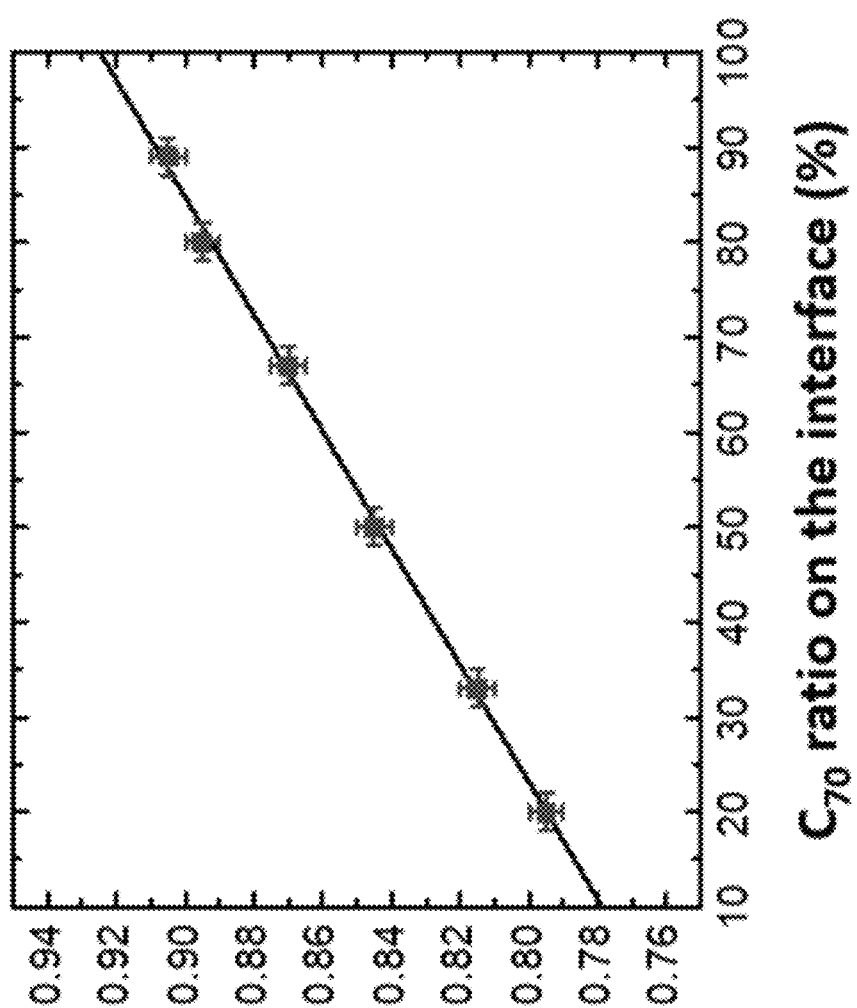
FIG. 2C is a graph of $V_{oc}$ for different $C_{70}$ ratios.

An exemplary device is shown in FIG. 2A, FIG. 2B, and FIG. 2C. The device structure is shown in FIG. 2A and the I-V curves for various DBP ratios are shown in FIG. 2B. The device 200 includes a cathode 201, an exciton blocking/electron transport layer 202, an active layer comprising DPB and C$_{70}$ 203, a bottom or interface layer 204 comprising DPB and C$_{70}$, an anode buffer layer 205, and an anode 206. The DPB ratio in the active layer 203 of the depicted device is 1:8, while the DBP ratio in the bottom layer 204 may be varied. As shown in the graph of FIG. 2B, as the DBP ratio in the bottom layer increases, the device $V_{oc}$ decreases while the $J_{sc}$ stays the same. The $V_{oc}$ shows a linear dependence on the bottom layer composition as shown in FIG. 2C. The graph of FIG. 2C shows the $V_{oc}$ for devices from FIG. 2B plotted against their $C_{70}$ ratios in the bottom layer. This suggests that the holes extracted through $C_{70}$ molecules carry more energy and provide higher device $V_{oc}$.

In the depicted embodiment, exciton blocking/electron transport layer 202 has a thickness of 7 nm, but in some embodiments the ETL may have a thickness of between 1 nm and 50 nm, or 1 nm and 20 nm, or between 2 nm and 10 nm, or between 4 nm and 10 nm. The depicted active layer 203 has a thickness of 54 nm, but may in some embodiments have a thickness of between 5 nm and 200 nm, or between 10 nm and 100 nm, or between 20 nm and 70 nm, or between 50 nm and 60 nm. The depicted bottom or interface layer 204 has a thickness of 2 nm, but may in some embodiments have a thickness of between 0.5 nm and 5 nm, or between 1 nm and 3 nm. The depicted anode buffer layer 205 has a thickness of 10 nm, but may in some embodiments have a thickness of between 1 nm and 100 nm, or between 2 nm and 50 nm, or between 5 nm and 20 nm, or any suitable thickness.

Figure 2D:
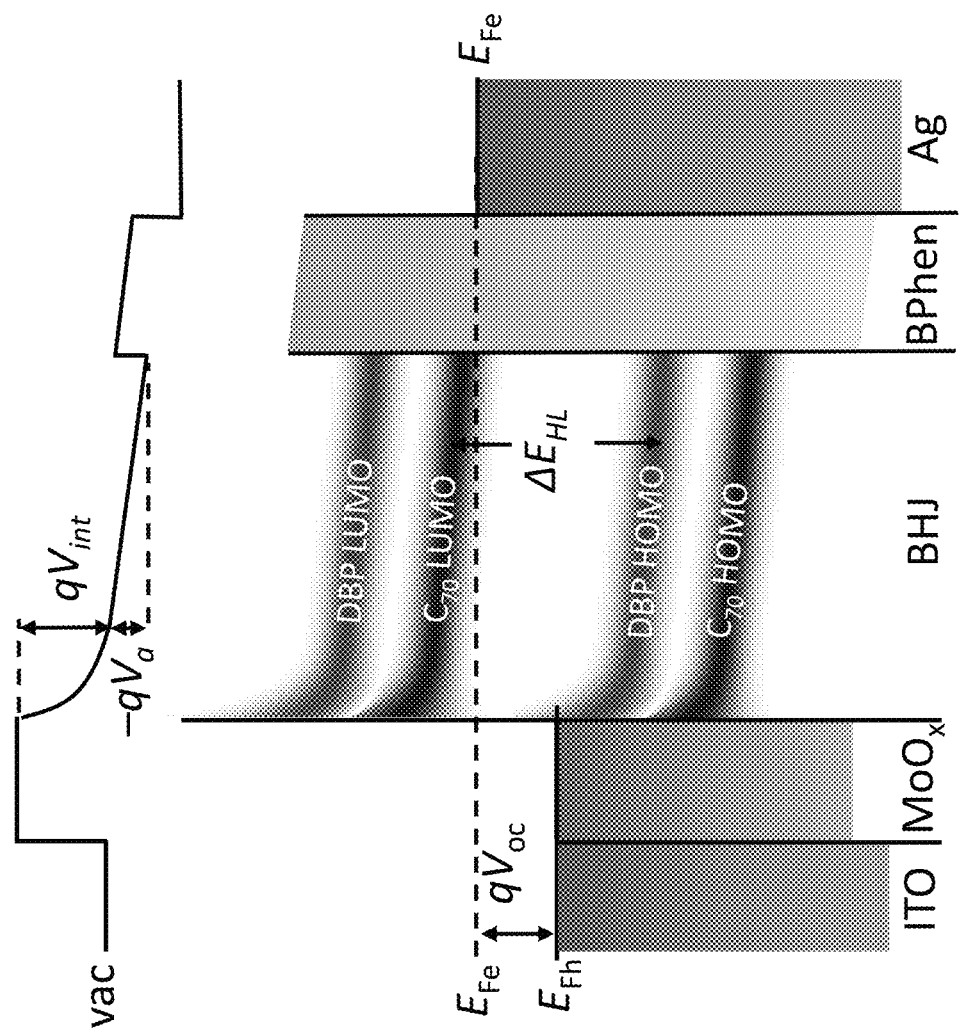
FIG. 2D shows an energy level diagram of an OPV.
Figure 4:
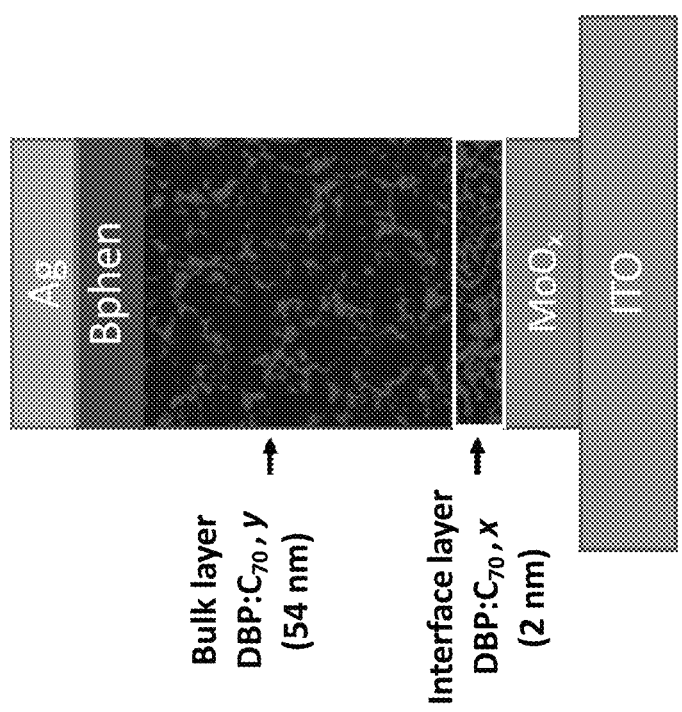
FIG. 4 is a diagram of an exemplary OPV device.

FIG. 2D shows the energy level diagram of the OPV of FIG. 4 at open circuit. The blurred red/blue lines represent the DBP/$C_{70}$ HOMOs with a finite width of the density of states. It is assumed that the hole quasi-Fermi level $E_{Fh}$ is at $\delta_1$ above the DBP HOMO level on the anode side, $E_{DBP}$, and electron quasi-Fermi level $E_{Fe}$ is at $\delta_2$ below the $C_{70}$ LUMO level on the cathode side, $E_{C70}$, $\delta_1$ and $\delta_2$ can be either positive or negative based on the energy alignment on the interfaces. $E_{DBP}$ and $E_{C70}$ have following relationship:

$$E_{DBP} = E_{C70} - \Delta E_{HL} q V_a + q V_{int} \quad \text{Equation 2}$$

where $\Delta E_{HL}$ is the energy offset between $C_{70}$ LUMO and DBP HOMO, $V_a$ is the voltage drop across the bulk (active) layer, $V_{int}$ is the voltage drop across the AIL due to the presence of a static interface dipole and q is the elementary charge. Note that the direction of $V_{int}$ is defined as opposite to that of $V_a$ and the external device voltage, V, by convention. Therefore, V is:

$$qV = E_{Fe} - E_{Fh} = (E_{C70} - \delta_2) - (E_{DBP} + \delta_1) = \Delta E_{HL} - \delta_2 - \delta_1 + qV_a - qV_{int} \quad \text{Equation 3}$$

Figures 2E, 2F:
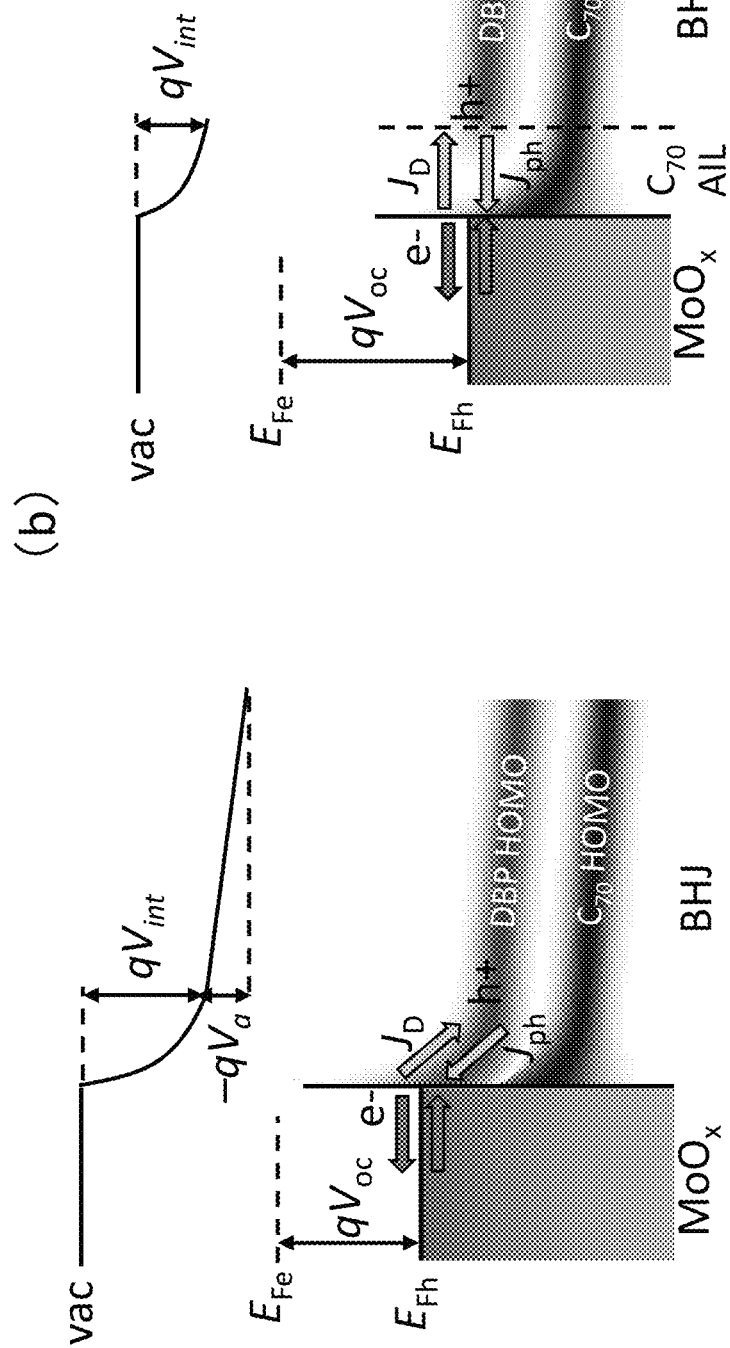
FIG. 2E shows an energy level diagram near the interface between a DBP/$C_{70}$ mixed layer and MoO$_x$ at open circuit.
FIG. 2F shows an energy level diagram near the interface between a DBP/$C_{70}$ mixed layer and MoO$_x$ at open circuit.

FIG. 2E shows the energy level diagram near the interface between a DBP/$C_{70}$ mixed layer and $MoO_x$ at open circuit, with the electron and hole currents represented by blue and yellow arrows, respectively. When forward-biased, electrons transfer from the organic HOMO into $MoO_x$, leaving holes in the organic that flow into the BHJ and recombine with electrons injected from cathode. This is the dark current $J_D$. Under illumination, a photocurrent, $J_{ph}$, generated in the active region flows through the ABL interface where photogenerated holes recombine with electrons in the $MoO_x$. While $J_D$ depends on both the interface and bulk properties, $J_{ph}$ depends primarily on recombination in the bulk, provided that interface recombination is insignificant. Under open-circuit conditions, $J_D = -J_{ph}$ and the total current is zero.

Because the BHJ blend morphology is isotropic, photogenerated charges require the guidance of the electric field in the BHJ to reach the electrodes. The direction of $J_{ph}$ is decided by the sign of $V_a$. Thus it follows that when $V_a = 0$, then $J_{ph} = 0$. Assuming the current dependences of $\delta_1$, $\delta_2$ and $V_{int}$ are small, Equation 3 becomes $$qV(J_{ph}=0) = \Delta E_{HL} - \delta_2 - \delta_1 - qV_{int} \quad \text{Equation 4}$$

Then, using Equation 3 and Equation 4, $$V = V(J_{ph}=0) + V_a \quad \text{Equation 5}$$

This scenario suggests that reducing $V_{int}$ may be an effective way to reduce energy losses at the active region/ABL interface. To achieve this objective, the DBP in the AIL can be eliminated, as shown in FIG. 2F. Shown in FIG. 2F is an energy level diagram near the interface between a DBP/$C_{70}$ mixed layer and $MoO_x$ at open circuit when a 2-nm-thick neat $C_{70}$ anode interface layer (AIL) is inserted between the bulk layer and the $MoO_x$. The deeper HOMO of $C_{70}$ pins the Fermi level of $MoO_x$, resulting in a reduced $V_{int}$. Hole transport between the DBP HOMO in the bulk and the $C_{70}$ HOMO in the AIL is required to extract photogenerated holes. As long as the AIL is thin, this transport can be via tunneling and hence is non-dissipative. Therefore, $V_{oc}$ will undergo a rigid shift without a change in $V_a$ and $J_{ph}$.

Some embodiments of the disclosed device may include multiple active layers, for example 2, 3, 4, 5, 6, or up to 10 active layers arranged next to one another and comprising the same or different donor and acceptor materials in the same or different ratios. One or more of the active layers in an embodiment of the disclosed device may include multiple donor and/or multiple acceptor materials in a single layer.

In the depicted embodiment, DBP is used as a donor material and $C_{70}$ is used as an acceptor material, but it is understood that one or both of these materials may be substituted with other materials. For example, suitable acceptor materials include, but are not limited to, (4,4,10,10-tetrakis(4-hexylphenyl)-5,11-(2-ethylhexyloxy)-4,10-di-hydro-dithienyl[1,2-b:4,5b']benzodi-thiophene-2,8-diyl)bis(2-(3-oxo-2,3-dihydroinden-1-ylidene)malononitrile) (herein referred to as "BT-IC"). BT-IC has planar structure with a small torsion angle<1° and consequently, a high electron mobility. In one embodiment, the acceptor is (4,4,10,10-tetrakis(4-hexylphenyl)-5,11-(2-ethylhexyloxy)-4,10-dihydro-dithienyl[1,2-b:4,5b'] benzodi-thiophene-2,8-diyl) bis(2-(3-oxo-2,3-dihydroinden-5,6-dichloro-1-ylidene) malononitrile (BT-CIC). This structure provides a narrow absorption band confined to the near-infrared spectrum through the introduction of high electron affinity halogen atoms (e.g., chlorine atoms). In one embodiment, the acceptor is TT-FIC (4,4,10,10-tetrakis(4-hexylphenyl)-4,10-dihydrothieno [2",3":4',5']thieno[3',2':4,5] cyclopenta[1,2-b]thieno[2,3-d]thiophene-2,8-diyl)bis(2-(3-oxo-2,3-dihydroinden-5,6-difluoro-1-ylidene) malononitrile). Additional examples of suitable acceptors for use with the present disclosure may be found in PCT Application No. PCT/US2018/059222 filed Nov. 5, 2018, PCT Application Publication No. WO2019143751, all of which are incorporated herein by reference in their entireties.

Similarly, any donor molecule may be useful within the devices of the present disclosure, as would be understood by one of ordinary skill in the art. Non-limiting examples of useful donor molecules include phthalocyanines, such as copper phthalocyanine(CuPc), chloroaluminium phthalocyanine (ClAlPc), tin phthalocyanine (SnPc), zinc phthalocyanine (ZnPc), and other modified phthalocyanines, subphthalocyanines, such as boron subphthalocyanine (SubPc), naphthalocyanines, merocyanine dyes, boron-dipyrromethene (BODIPY) dyes, diindenoperylene (DIP), squaraine (SQ) dyes, tetraphenyldibenzoperiflanthene (DBP), 2-((7-(5-(dip-tolylamino)thiophen-2-yl)benzo[c][1,2,5]thiadiazol-4-yl)methylene)malononitrile (DTDCTB), 2 is (2-[(7-(4-[N,N-bis(4-methylphenyl) amino]phenyl)2,1,3-benzothia-diazol-4-yl) methylene]propane-dinitrile)

(DTDCPB), 2-((7-(N-(isobutyl)-benzothieno[3,2-b]thieno [2,3-d]-pyrrol-2-yl)benzo[c][1,2,5] thiadiazol-4-yl) methylene)malononitrile (iBuBTDC), 2-{[2-(4-N,N-ditolylaminophenyl)-pyrimidin-5-yl]methylene}malononitrile (DTDCPP), poly[4,8-bis(5-(2-ethylhexyl)thiophen-2-yl) benzo[1,2-b;4,5-b$^1$] dithiophene-2,6-diyl-alt-(4-(2-ethylhexyl)-3-fluorothieno[3,4-b]thiophene-)-2-carboxylate-2-6-diyl)] (PCE-10), or a derivative thereof and derivatives thereof. Examples of squaraine donor materials include but are not limited to 2,4-bis [4-(N,N-dipropylamino)-2,6-dihydroxyphenyl] squaraine, 2,4-bis[4-(N,N-diisobutylamino)-2,6-dihydroxyphenyl] squaraine, 2,4-bis[4-(N,N-diphenylamino)-2,6-dihydroxyphenyl] squaraine (DPSQ). Additional non-limiting examples of useful donor molecules can be found in US 2018/0343966, filed Jan. 15, 2015, and PCT Application Publication No. WO2019143751, all of which are incorporated by reference herein in their entireties. In one embodiment, the donor molecule is DTDCPB. In another embodiment, the donor molecule is iBuBTDC. In one embodiment, the donor molecule is DTDCPP. In one embodiment, the donor is PCE-10.

Although in the depicted embodiments of FIG. 2A and FIG. 4, the active layer 203 and bottom/interface layer 204 are contemplated as comprising the same donor materials and acceptor materials in different ratios, it is understood that in some embodiments, a different donor and/or acceptor material may be used in the bottom/interface layer than the donor and/or acceptor materials used in the active layer. In some embodiments, the ratios of the donor and acceptor materials may be consistent across the substrate, but in other embodiments the ratios of the donor and acceptor materials may vary in the active layer and/or in the bottom/interface layer.

In the depicted embodiment the cathode 201 comprises Ag and the anode 206 comprises ITO, but it is understood that the anode and cathode may comprise any suitable conductive material, including but not limited to Aluminum, Copper, Zinc, Magnesium, or the like. In the depicted embodiment, the anode comprises a transparent conducting material and the cathode comprises a reflective conductive material, but in different embodiments the cathode may comprise a transparent conductive material while the anode is reflective. In some embodiments, a non-transparent electrode may be a reflective electrode, a diffuse reflective electrode, an opaque electrode, or the like.

The depicted electron transport layer 202 comprises Bphen, but could alternatively or additionally comprise any suitable material, including but not limited to Bphen doped with C60, TPBi, or any other suitable material. The depicted active layer 203 comprises DBP and $C_{70}$ in a ratio of 1:8, but could alternatively comprise different ratios of the two materials, including but not limited to 1:1, 1:2, 1:4, 1:6, 1:7, 1:9, 1:10, 1:20, or any other suitable ratio. In some embodiments, the ratio of the two materials may be inverted, for example 2:1, 3:1, 4:1, 8:1, or the like. Similarly, the bottom/interface layer 205 could have the two materials listed in any suitable ratio, and several specific ratios are listed and evaluated in the graphs herein.

Figure 3:
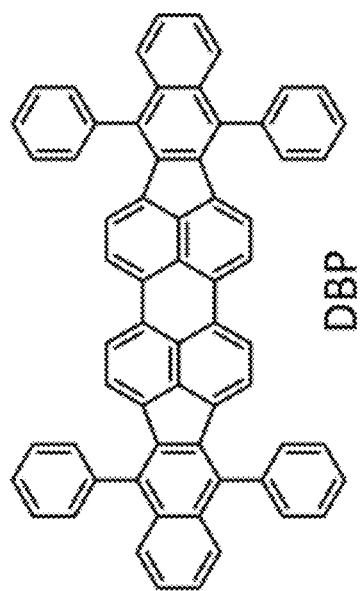
FIG. 3 is a set of chemical structures for use with the disclosed devices.
Figure 3:
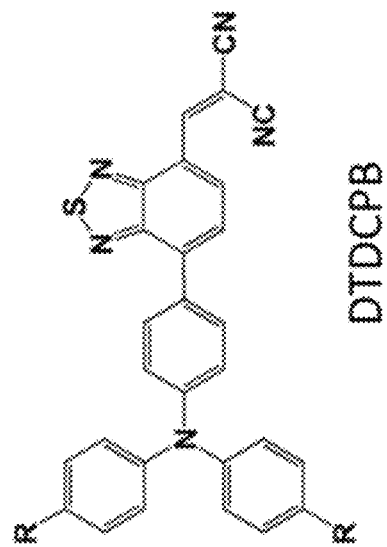
Figure 3:
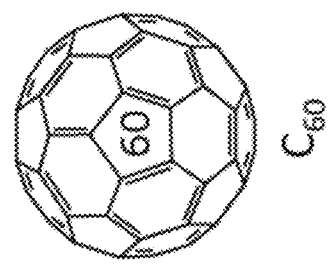
Figure 3:
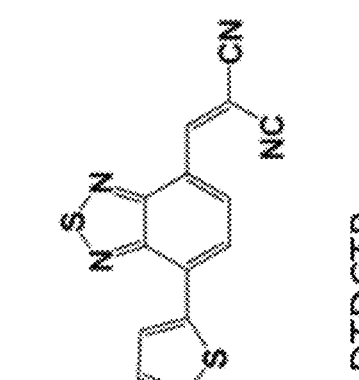
Figure 3:
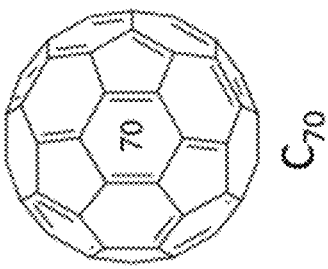

To utilize the hole transporting property of the acceptor molecules near the $MoO_x$ interface and reduce the energy loss, a thin layer of acceptor molecules is inserted between the $MoO_x$ layer and the mixed active layer. The thickness of this layer may in some embodiments be near λ as outlined above. For $C_{70}$, λ=3 nm, which is well below the exciton diffusion length. Therefore, the exciton loss in this neat acceptor layer is neglected. Normally, a neat acceptor layer acts as a hole blocking layer and thus impedes the charge collection process. But due to the HOMO energy shift near the $MoO_x$ interface as described above, the hole energy level of acceptor molecules in this layer has been shifted up by ΔE, making it close to the hole energy level of donor molecules in the active layer. Therefore, the holes can transport through this layer and get collected at a deeper energy level compared with that in conventional devices without this layer. The addition of this acceptor bottom layer results in an increase of $V_{oc}$ without much influence on the $J_{sc}$ and FF. Performances of devices with and without this acceptor bottom layer are shown in Table 1. All devices have a device structure shown in FIG. 2A except for the active layer and bottom layer. The structures of all molecules used are shown in FIG. 3.

TABLE

| Device Active Layer | $J_{sc}$ (mA/cm$^2$) | $V_{oc}$ [V] | FF | PCE [%] |
|---|---|---|---|---|
| DBP/C$_{70}$ (1:2, 54 nm) | 11.3 | 0.86 | 0.504 | 4.89 |
| DBP/C$_{70}$ (1:2, 54 nm) * | 11.5 | 0.88 | 0.507 | 5.15 |
| DBP/C$_{70}$ (1:4, 60 nm) | 12.6 | 0.86 | 0.536 | 5.79 |
| DBP/C$_{70}$ (1:4, 60 nm) * | 12.6 | 0.88 | 0.538 | 5.92 |
| DTDCPB/C$_{70}$ (1:1, 80 nm) | 14.4 | 0.92 | 0.670 | 8.85 |
| DTDCPB/C$_{70}$ (1:1, 80 nm) * | 14.4 | 0.94 | 0.674 | 9.04 |
| DTDCPB/C$_{70}$ (1:2, 80 nm) | 13.9 | 0.90 | 0.702 | 8.80 |
| DTDCPB/C$_{70}$ (1:2, 80 nm) * | 14.1 | 0.92 | 0.705 | 9.14 |
| DTDCPB/C$_{70}$ (1:3, 80 nm) | 13.7 | 0.88 | 0.727 | 8.76 |
| DTDCPB/C$_{70}$ (1:3, 80 nm) * | 13.7 | 0.92 | 0.708 | 8.92 |
| DTDCTB/C$_{60}$ (1:3, 80 nm) | 10.4 | 0.80 | 0.467 | 3.89 |
| DTDCTB/C$_{60}$ (1:3, 80 nm) * | 10.6 | 0.84 | 0.464 | 4.14 |

The devices labeled with a * in Table 1 above include a 3 nm-thick neat acceptor layer inserted between the $MoO_x$ layer and the active layer.

As shown in Table 1, all the devices show an increase in $V_{oc}$ with the acceptor bottom layer while the Jsc and FF show little if any difference. The material of the bottom layer is not limited to the acceptor material of the active layer, and comprise any suitable acceptor material, including but not limited to perylene diimides, non-fullerene acceptors, or the like. A preferred bottom layer material should have a HOMO energy level that is above the donor HOMO by ΔE as defined in previous section. The thickness of this layer should be near or below the energy shifting depth λ as described above in order to avoid creating an energy barrier for hole extraction.

In some embodiments, the thickness of the interface/bottom layer is between 1 nm and 10 nm, or between 2 nm and 7 nm, or between 2 nm and 5 nm, or about 3 nm or about 2 nm.

In another aspect, a method of fabricating an organic photovoltaic device according to the above description is disclosed. The method comprises providing a first electrode layer, and depositing an interface layer comprising a first acceptor material and a first donor material in a first ratio over the first electrode layer. The first acceptor material and first donor material can be any suitable donors and acceptors, and in some embodiments the interface layer may comprise more than one acceptor material and/or more than one donor material, being deposited at various total ratios of donor to acceptor. Suitable donor and acceptor materials for use with the disclosed method are described in more detail elsewhere in the specification. The deposited interface layer may have any suitable thickness, and in some embodiments the interface layer is deposited via vacuum thermal evaporation. The first ratio may be achieved by holding the deposition rate of either one of the donor or acceptor constant, while varying the deposition rate of the other of the donor or acceptor, while continually evaluating, for example via optical tracking or some other means, the corresponding deposition rates of the two materials on the electrode layer.

In addition to the interface layer, embodiments of the disclosed method include deposition of an active layer comprising the same or a different acceptor material(s) and the same or different donor material(s) as the interface layer, in the same or a different ratio of deposition. In some embodiments, the thickness of the active layer is greater than the thickness of the donor material, for example in some embodiments the thickness of the donor material may be 2×, 5×, 8×, 10×, 15×, 20×, 30×, or any multiple in between of the thickness of the interface layer. In other embodiments, the thickness of the active layer may be substantially the same as or less than the thickness of the interface layer. In some embodiments, a disclosed method may comprise steps of depositing multiple active layers having the same or varying thickness, comprising the same or varying materials in the same or varying ratios. Although layers disclosed herein are contemplated as being arranged in any suitable order, in some disclosed embodiments the interface layer is positioned between the anode and the one or more active layers.

Figure 5:
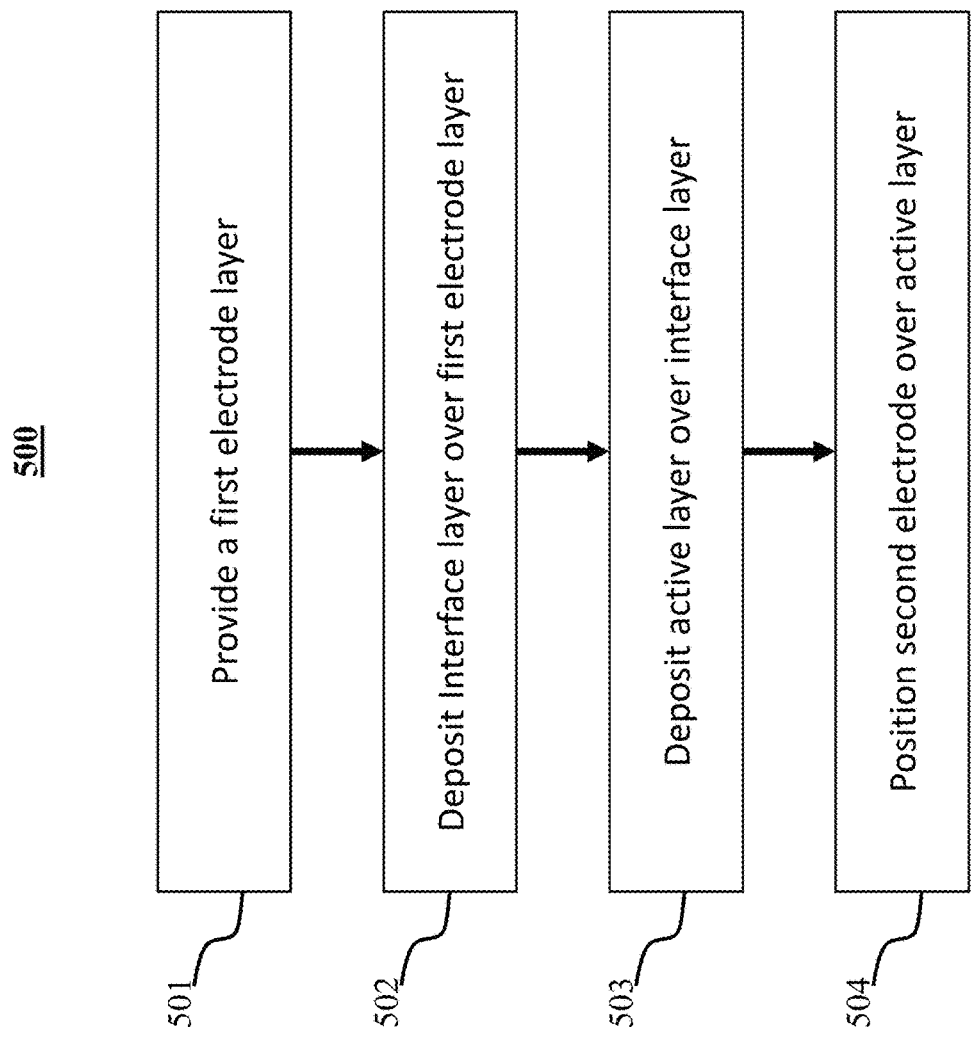
FIG. 5 is a method of making an OPV device.

With reference to FIG. 5, a method of the disclosure is shown. The method 500 includes the steps of providing a first electrode layer in step 501, depositing an interface layer over the first electrode layer in step 502, depositing an active layer over the interface layer in step 503, and depositing a second electrode layer over the active layer in step 504.

EXPERIMENTAL EXAMPLES

The disclosure is further described in detail by reference to the following experimental examples. These examples are provided for purposes of illustration only, and are not intended to be limiting unless otherwise specified. Thus, the disclosure should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present disclosure. The following working examples therefore, specifically point out the exemplary embodiments of the present disclosure, and are not to be construed as limiting in any way the remainder of the disclosure.

Device Fabrication

OPV cells were fabricated on glass substrates pre-coated with indium tin oxide (ITO). The substrates were solvent-cleaned and exposed to ultraviolet ozone for 10 min before transferring to a vacuum thermal evaporation chamber with a base pressure of $10^{-7}$ Torr. Device structures used in this study are: ITO/ABL (MoO$_x$ (10 nm))/C$_{70}$:DBP (2 nm, x)/C$_{70}$:DBP (54 nm, y)/BPhen (8 nm)/Ag (100 nm), where x=0 to 1, and y=0.2 to 0.9 are the C$_{70}$ concentrations in the interface and bulk layers, respectively (see FIG. 4). Alternative ABL layers were fabricated with PEDOT:PSS and HAT-CN. The PEDOT:PSS solution was filtered with a 0.45 μm Nylon syringe filter and spin coated onto the substrate at 6,000 rpm for 60 s. The sample was then annealed at 150° C. for 30 min. The thickness of the PEDOT:PSS layer was measured to be 40-50 nm using an ellipsometer.

The MoO$_x$ and HAT-CN layers were deposited at rates between 0.2 to 1.6 Å/s. The mixed active layers were co-deposited using a DBP deposition rate of 0.2 Å/s while the deposition rate of C$_{70}$ was adjusted to achieve the desired volume ratio. The devices were tested in a glovebox filled with ultrapure N$_2$ (<1 ppm O$_2$ and H$_2$O) in the dark and under simulated AM1.5G illumination from a calibrated solar simulator at an intensity of 100 mW/cm$^2$ (1 sun equivalent).

Photoluminescence (PL) spectra of the active layers were measured by growing 200 nm-thick thin films on sapphire substrates and exciting them in vacuum by a continuous wave He—Cd laser with a wavelength of 442 nm. The PL spectra were collected normal to the substrate using a fiber-coupled monochromator combined with a Si charge-coupled device array and an InGaAs photoreceiver.

The highest occupied molecular orbital (HOMO) energies of organic layers near the MoO$_x$ interface were measured by growing organic films with various thicknesses on a predeposited, 10-nm-thick MoO$_x$ layer. Samples were deposited as in the OPV and PL samples, and transferred into a vacuum chamber with base pressure of $10^{-7}$ Torr. The HOMO energy was measured using UPS with a 21.2 eV UV photon source at −8.0 V bias.

To determine the electric field and potential drop across the active region/ABL interface, the nanoscale connectivity between donor and acceptor molecules within the BHJ must be considered. For this purpose, Monte Carlo simulations were developed to provide a suitable method for modeling the discrete paths and electron transfer processes taken by individual charges across the AIL, as well as the hole dynamics in the active region. From this, the static charge density distribution near the active region/ABL interface was obtained, which allowed for quantitative determination of the magnitude of the interface dipole and voltage drop, $V_{int}$.

Results

Figure 6A:
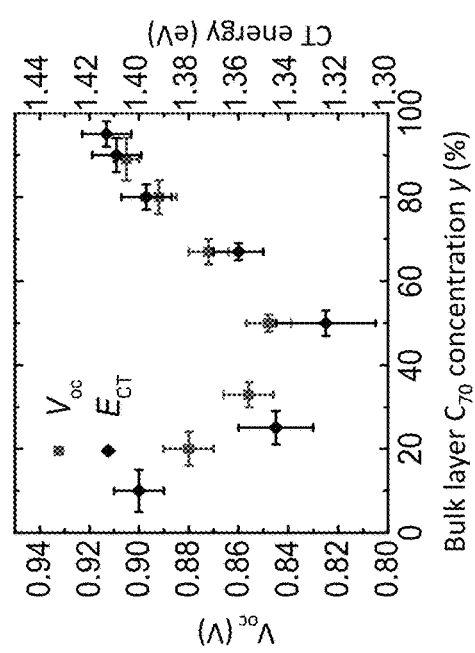
FIG. 6A is a set of graphs of experimental data.
Figure 6A:
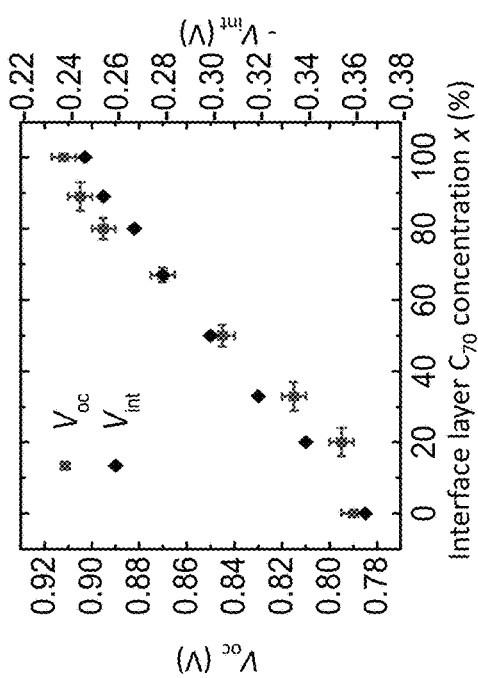
Figure 6A:
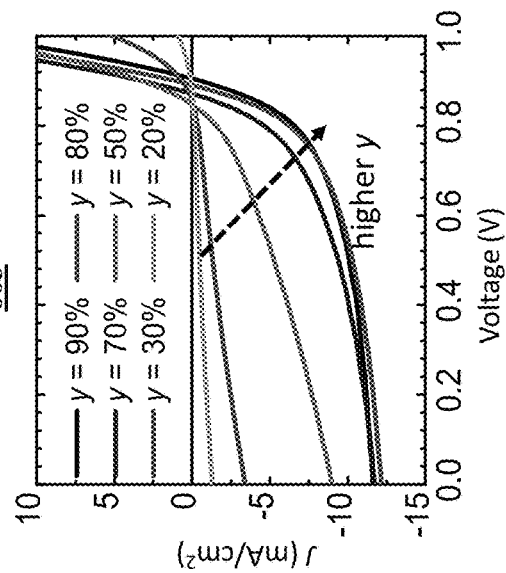
Figure 6A:
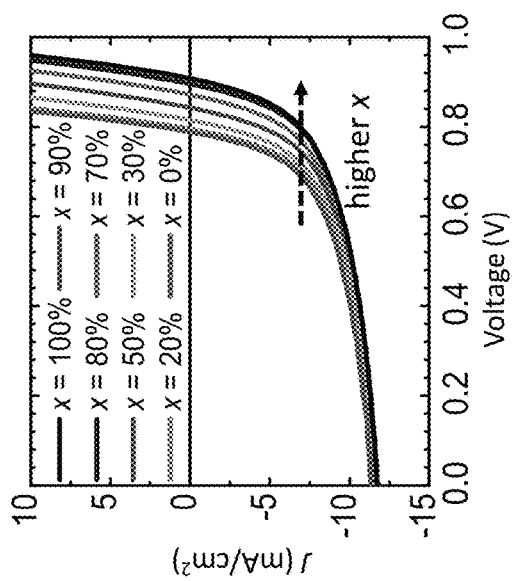

Graph 601 in FIG. 6A shows the current density-voltage (J-V) characteristics of devices with MoO$_x$ as the ABL, a bulk layer C$_{70}$ concentration of y=90%, and various C$_{70}$ concentrations, x, in the AIL under 1 sun, simulated AM1.5G illumination. As x increases, the measured J-V characteristics rigidly shift to higher voltage, as shown in graph 602 (red squares), whereas $J_{sc}$ is nearly unchanged. The $V_{oc}$ difference, ΔV, between devices with a neat C$_{70}$ AIL and a neat DBP AIL is 0.12±0.01 V. The calculated values of the interfacial potential drop ($V_{int}$) at various x, are also plotted in graph 602 (diamonds), showing quantitative agreement with the measurement.

Graph 603 shows the J-V characteristics of devices with constant AIL C$_{70}$ concentration (x=100%) and various y, with $V_{oc}$ shown in graph 604 (red squares) along with CT state energies acquired from their photoluminescence (PL) spectra (black diamonds). The $V_{oc}$ and CT exciton energy have similar dependences on y, both showing a minimum near y=50%, which has previously been shown to be due to the minimization of C$_{70}$ and DBP aggregate formation. These results suggest that the energy loss in the bulk active layer is directly related to the CT state energies, while there is an additional energy loss at the MoO$_x$/organic interface that depends on x.

Figure 6B:
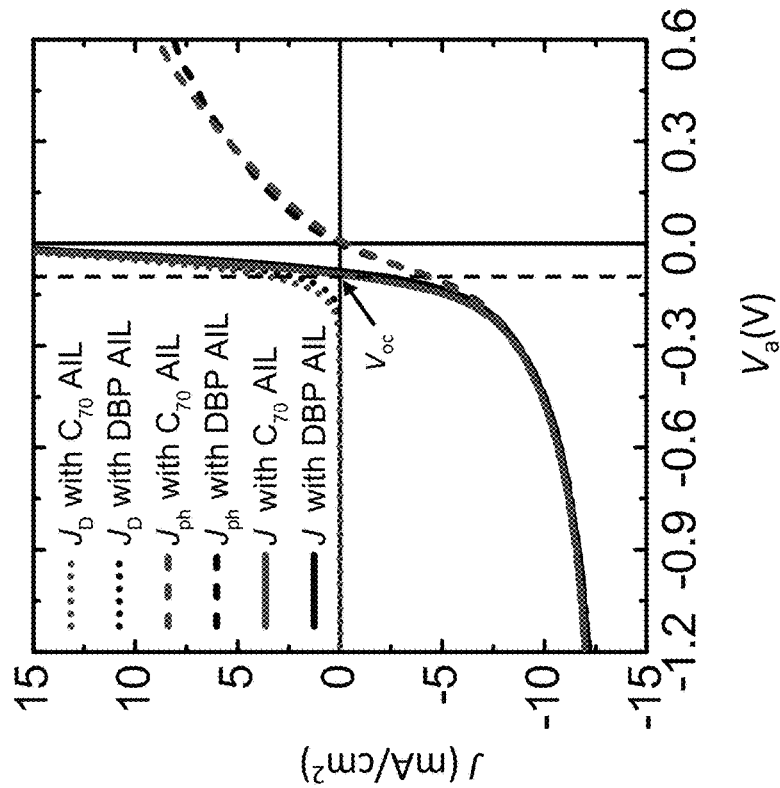
FIG. 6B shows graphs of current density for different OPV devices.
Figure 6B:
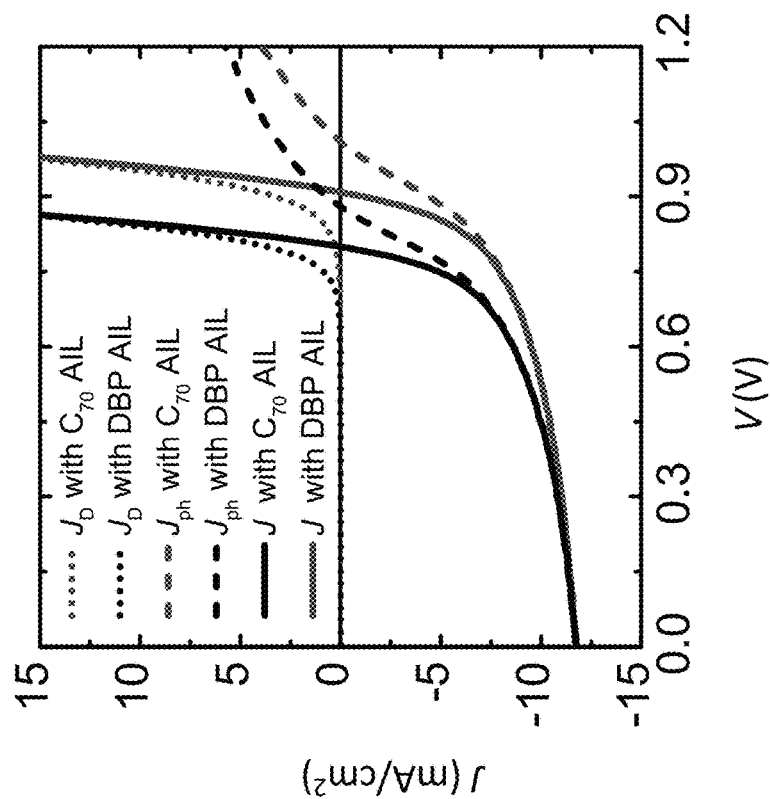
Figure 9:
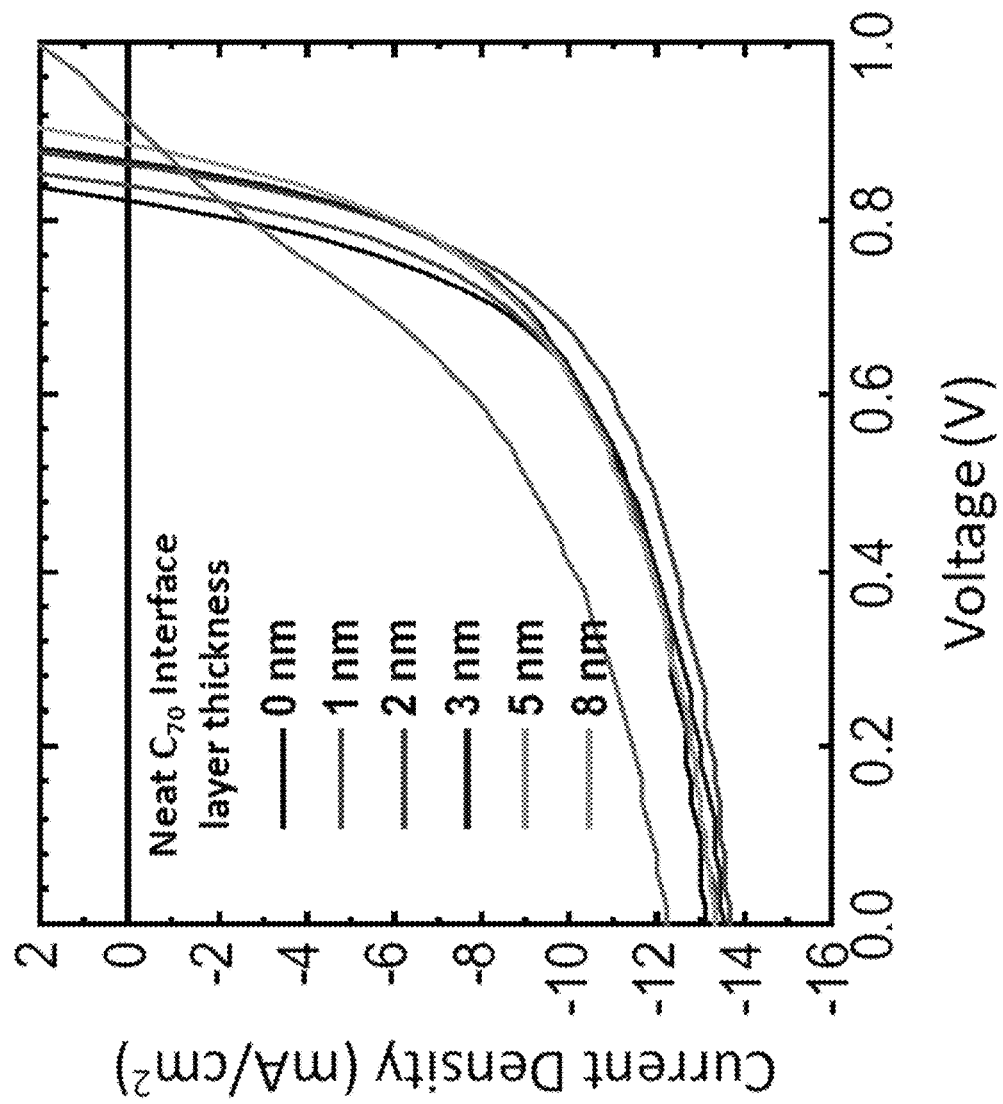
FIG. 9 is a graph of current density over $V_{oc}$ for different $C_{70}$ ratios.

To separate the dependences of $J_D$, $J_{ph}$ and J on voltage, $J_{ph}$ was calculated by subtracting $J_D$ from the total current, J, and the contributions of dark current density $J_D$ (dotted), photocurrent density $J_{ph}$ (dash) and total current density J (solid) of devices with a C$_{70}$ (red), and a DBP AIL (black) are plotted in graph 605 in FIG. 6B. Using Equation 5, the J-V characteristics in graph 605 were replotted with reference to $V_a$ for each device in graph 606. The vertical dashed line corresponds to $V_{oc}$. FIG. 9 shows the J-V characteristics of OPVs with neat $C_{70}$ AILs of various thickness. The bulk layer of all devices consists of DBP as donor and $C_{70}$ as acceptor with y=80%. As the AIL thickness increases from 0 to 5 nm, $V_{oc}$ increases while the $J_{sc}$ remains nearly constant. When the AIL is 8-nm-thick, however, $J_{sc}$ and FF decrease and the curve exhibits a weak inflection near $V_{oc}$.

Figure 6C:
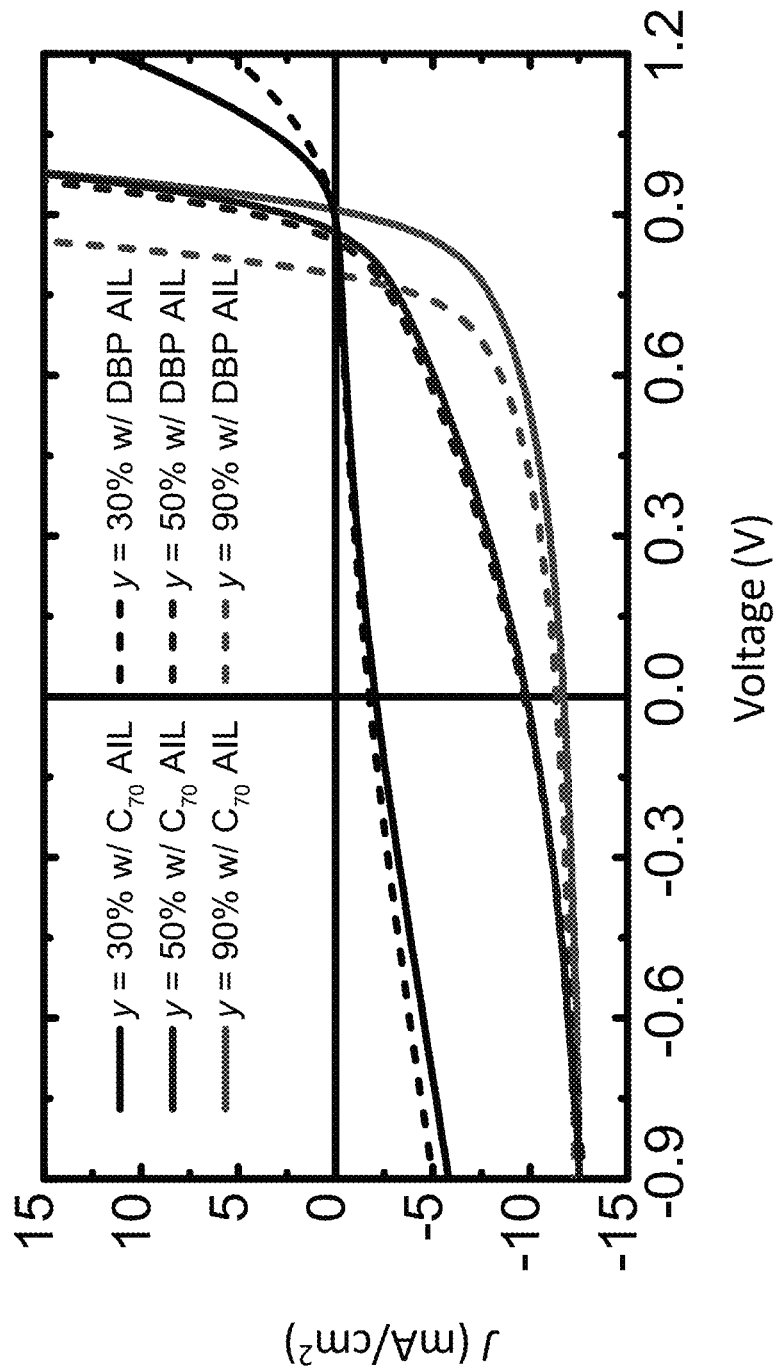
FIG. 6C shows illuminated J-V characteristics of OPV devices.
Figure 6D:
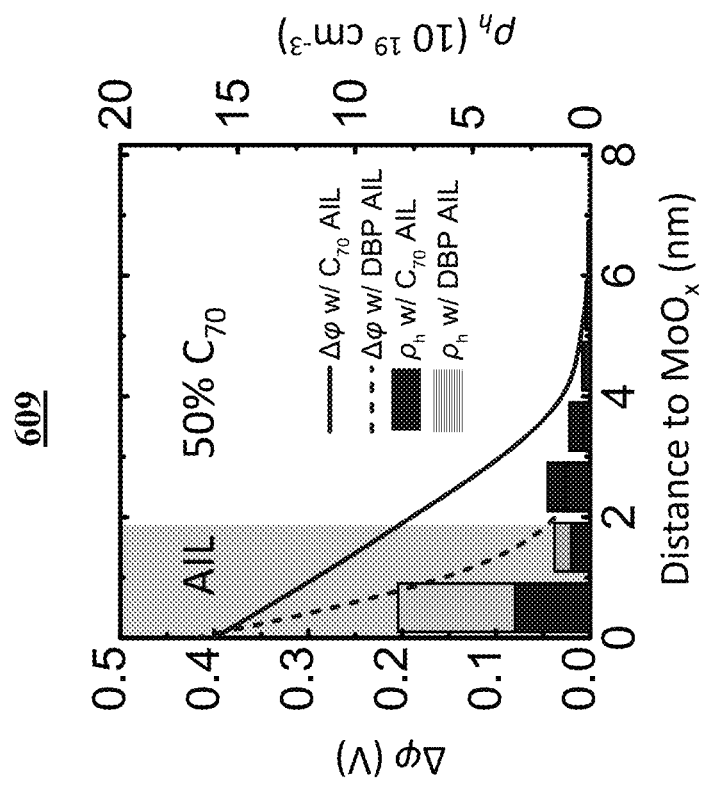
FIG. 6D shows simulated results of the hole density and electric potential shift from the bulk near the active region/ABL interface for OPV devices.
Figure 6D:
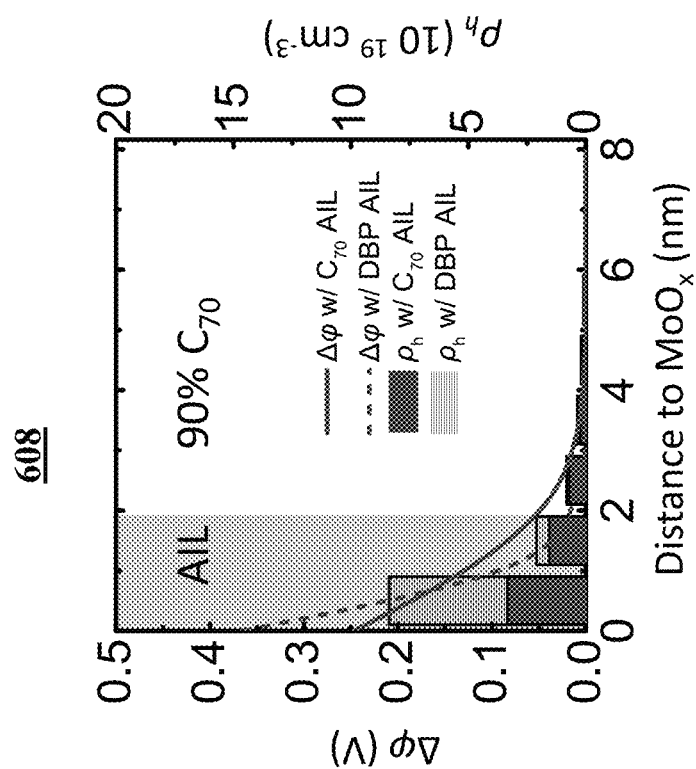

As x increases, the J-V characteristics shift to higher voltages. Graph 607 in FIG. 6C shows the illuminated J-V characteristics of OPVs with a neat $C_{70}$ AIL (solid line) and a DBP AIL (dashed line), and y=90% (red), 50% (blue) and 30% (black), respectively. For y=90% and 50%, different AILs exhibit rigid horizontal shifts of their J-V characteristics. The voltage shift $\Delta V$ =0.02±0.01 V for devices with y=50%, is smaller than that for devices with y=90% ($\Delta V$=0.12±0.01 V). For y=30%, the J-V characteristics show only a weak photoresponse with a high resistance in the forward biased direction. The simulated results of the hole density $\rho_h$ (histogram) and electric potential shift from the bulk $\Delta\varphi$ (lines) near the active region/ABL interface for devices with a $C_{70}$ AIL or a DBP AIL and y=90% and y=50% are plotted in graphs 608 and 609, respectively, in FIG. 6D. The $V_{int}$ is equal to $\Delta\varphi$ at z=0 nm.

Figure 6E:
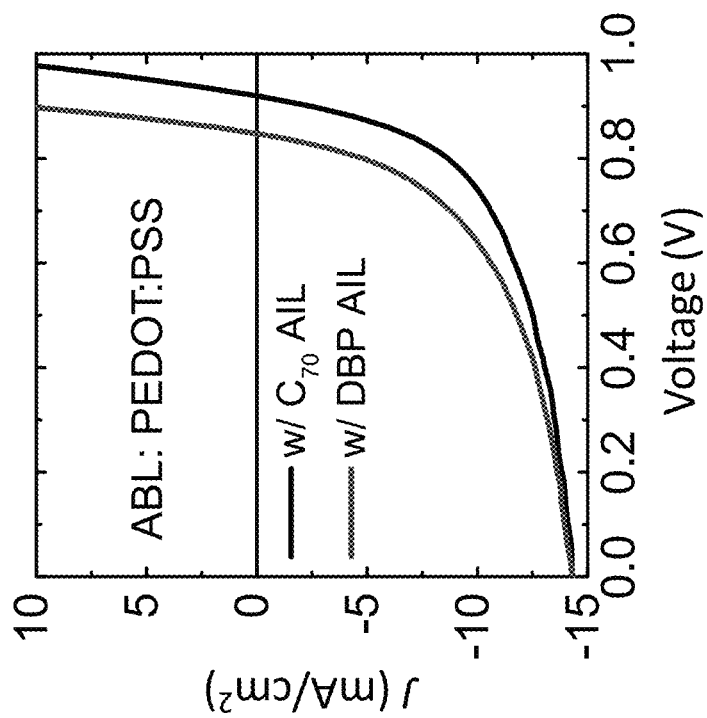
FIG. 6E shows graphs of J-V characteristics of OPVs.
Figure 6E:
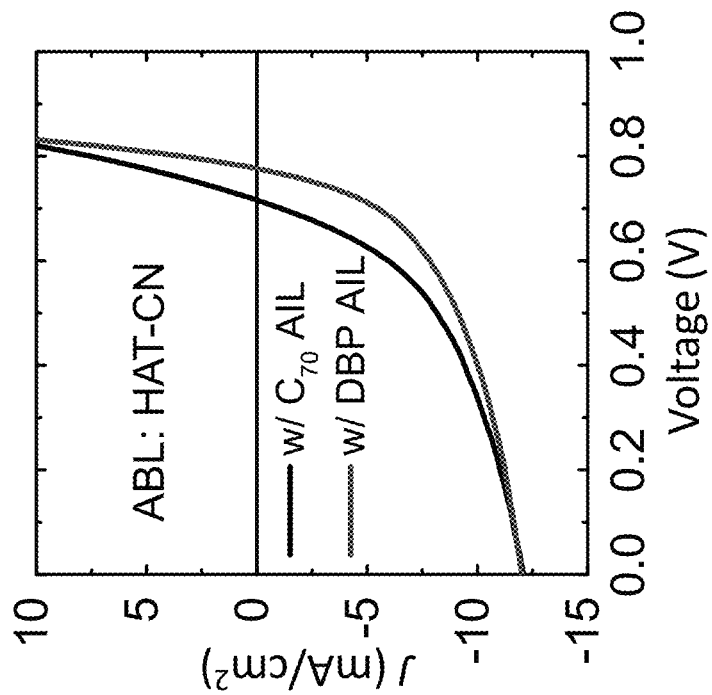

The J-V characteristics of OPVs under illumination with a PEDOT:PSS ABL are shown in graph 610 of FIG. 6E with y=90% and a $C_{70}$ AIL (black) or a DBP AIL (red). The device with a $C_{70}$ AIL shows a larger $V_{oc}$ but a similar $J_{sc}$ and FF as the device with a DBP AIL, which is comparable to the case with a $MoO_x$ ABL. The OPV J-V characteristics with a HAT-CN ABL are shown in graph 611 with y=90% and a $C_{70}$ AIL (black) or a DBP AIL (red). The device with a $C_{70}$ AIL shows a reduced $V_{oc}$ and FF.

Figure 6F:
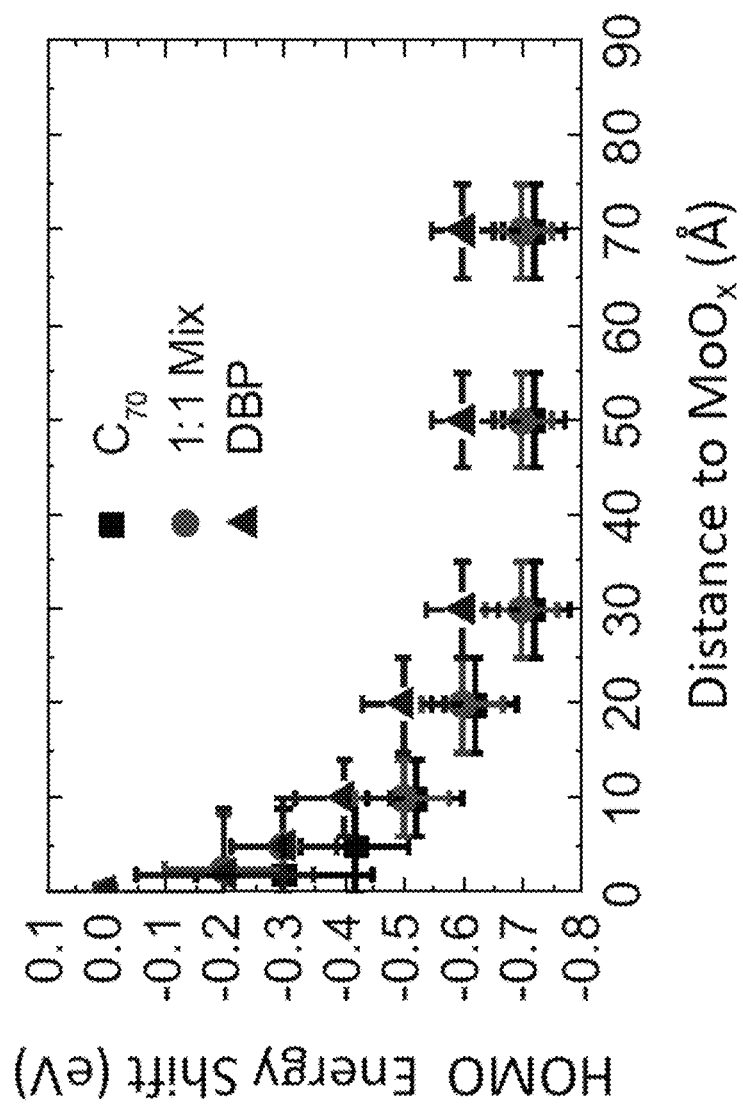
FIG. 6F shows a graph of HOMO energy shift along the distance from an MoO$_x$ layer.

The HOMO energy bending measured by UPS occurs over a distance of $\lambda$=30±10 Å from the $MoO_x$ interface, as shown in FIG. 6F. This bending has previously been shown to result from a surface dipole formed by electron transfer from the organic to the $MoO_x$, (see e.g. J. Meyer et al., "Transition metal oxides for organic electronics: Energetics, device physics and applications," *Adv. Mater.* 24, 5408 (2012); J.-P. Yang, et al. "Mechanism for doping induced p type c60 using thermally evaporated molybdenum trioxide (moo3) as a dopant," *J. Phys. Condens. Matter* 28, 185502 (2016); C. Wang, et al., "Role of molybdenum oxide for organic electronics: Surface analytical studies," *J. Vac. Sci. Technol.* 32, 040801 (2014); and Irfan, M. et al., "Strong interface p-doping and band bending in c60 on moox," *Org. Electron.* 12, 1588 (2011), all of which are incorporated herein by reference).

For the two organic materials studied here, the total shift in the HOMO energy is $\Delta E$=0.3±0.1 eV, which is due to Fermi level pinning by $MoO_x$ surface states.

Figure 6G:
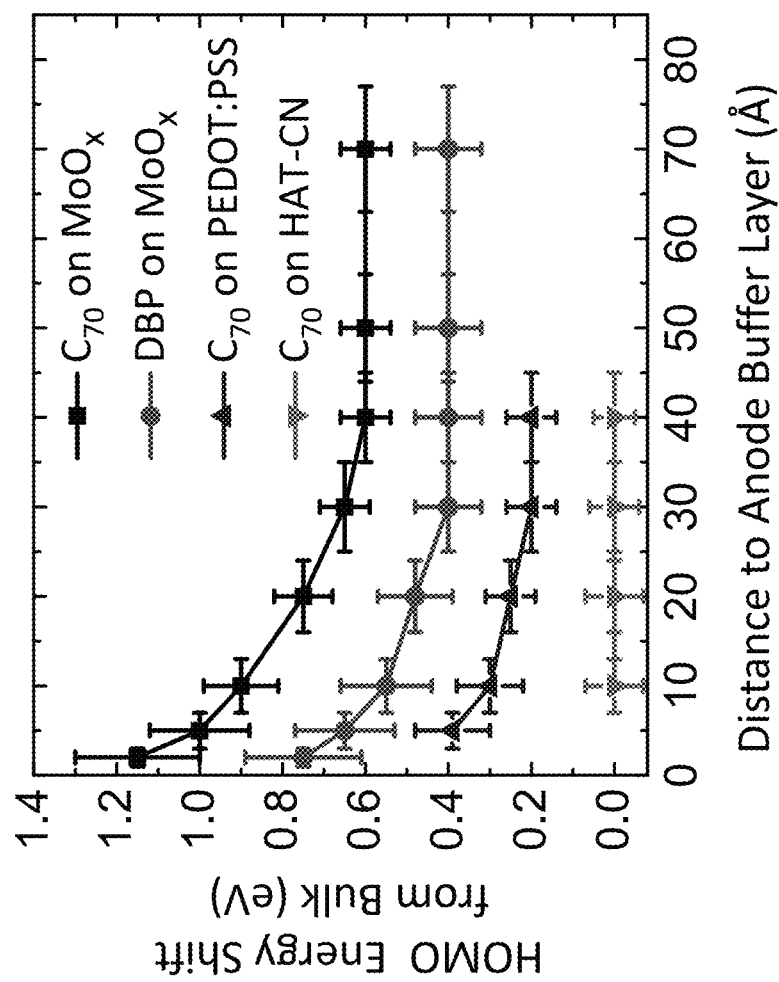
FIG. 6G shows a graph of HOMO energy shift along the distance from an ABL.

The HOMO energies proximal to the ABL interface measured by UPS are shown in FIG. 6G. The energies are graphed according to distance from the ABL interface for $C_{70}/MoO_x$ interface (black), DBP/$MoO_x$ interface (red), $C_{70}$/PEDOT:PSS interface (blue) and $C_{70}$/HAT-CN interface (pink) measured by ultraviolet photoelectron spectroscopy. The vertical error bars represent the energy resolution of the measurement and the horizontal error bars represent the uncertainty of the organic layer thickness. For $MoO_x$ and PEDOT:PSS, there is bending of the organic HOMO energy near the ABL. The energy bending has previously been shown to result from a static interface dipole formed by electron transfer from the active region to the $MoO_x$ and PEDOT:PSS. The total bending in the $C_{70}$ HOMO energy is 0.4±0.2 eV for $MoO_x$, and 0.2±0.1 eV for PEDOT:PSS. The energy bending extends over a distance of $\lambda$=30±10 Å from the ABL interface. For $C_{70}$/HAT-CN interface, no energy bending is observed.

Theory and Simulations

Figure 7:
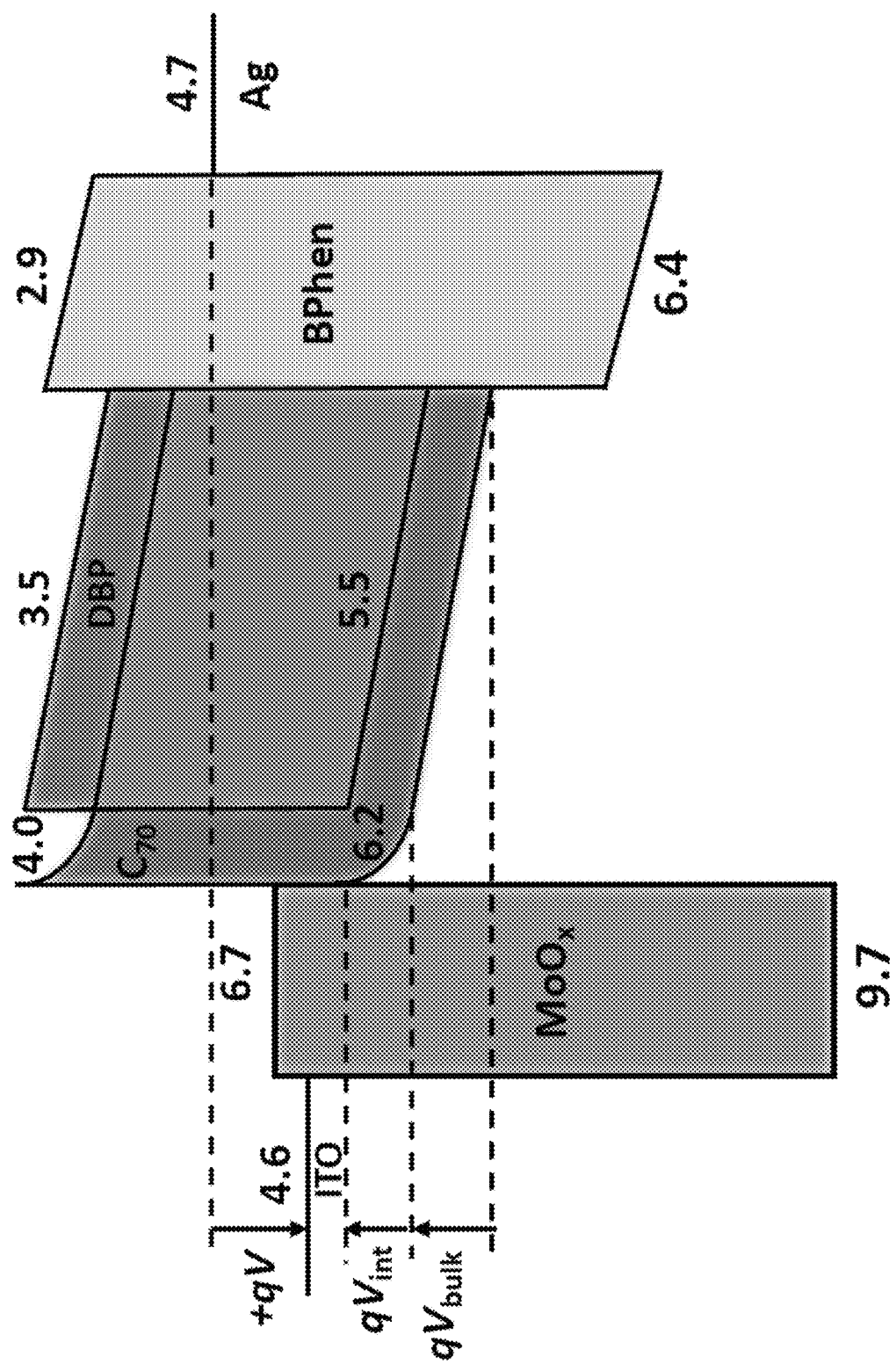
FIG. 7 is an energy level diagram of a forward-biased OPV.

An energy level diagram of a forward-biased OPV is shown in FIG. 7. The total potential drop across the device is the sum of four components:

$$V=V_{bi}-V_{bulk}-V_{int}-V_{other} \quad \text{Equation 6}$$

where $V_{bi}$ is the built-in voltage, $V_{bulk}$ is the potential drop on the bulk layer, $V_{int}$ is the potential drop at the organic/$MoO_x$ interface, and $V_{other}$ is the potential drop on other layers or interfaces comprising the device. For a given J, devices with identical y but different x are expected to have the same $V_{bi}$, $V_{bulk}$ and $V_{other}$, but different $V_{int}$. That is, for the devices in graph 602 of FIG. 6A, $qV_{int}$ is the interfacial energy loss of the device, where q is the electron charge.

Kinetic Monte Carlo simulations were used to determine the charge distribution near the organic/$MoO_x$ interface as a means for estimating $V_{int}$. For y>0.5, $V_{int}$ has a weak dependence on J as shown in graph 607. Thus, $V_{int}$ needed only to be calculated in the open circuit condition (J=0) to describe the rigid shift in J-V characteristics. There were three charge transfer processes considered in the simulation: electron transfer from the organic to the $MoO_x$ layer, recombination of electrons in $MoO_x$ with holes in the organic, and hole diffusion in the organic. The simulation consisted of a 100 nm×100 nm×10 nm thick organic layer where the molecules formed a simple cubic lattice with a 1 nm lattice constant. The frontier orbitals of the organics were assumed to be accurately described by a Gaussian distribution with a standard deviation of 0.1 eV. Initially, both the $MoO_x$ and organic layers were neutral. As simulation proceeded, electrons transferred from the HOMOs of both the donor and acceptor to the $MoO_x$ conduction band due to its high work function (6.8 eV), which pins the Fermi level of the $MoO_x$ to near the HOMO of the organic layer, leaving behind holes in the organic layer. The electric field from the resulting static interface dipole causes the orbital energies near the interface to bend towards the lower binding energy direction, while also broadening the density of states (DOS) on the organic side of the interface.

The charge transfer rate from organic molecules to $MoO_x$ was assumed to follow Miller-Abrahams hopping:

$$P = P_0 \begin{cases} e^{\left(-\frac{E_F-E_i}{kT}\right)}; & E_F > E_i \\ 1; & E_F < E_i \end{cases} \quad \text{Equation 7}$$

where $E_F$ is the $MoO_x$ Fermi level, $E_i$ is the HOMO energy of molecule i, $P_0$ is the maximum hopping rate that is proportional to the overlap between the electron wavefunctions in the organic and $MoO_x$, k is the Boltzmann constant, and T is the temperature.

After charge transfer, the holes in the organic can either diffuse among neighboring molecules, or recombine with electrons in the $MoO_x$. The wait time of each event was:

$$\tau = -\frac{\ln x}{P} \quad \text{Equation 8}$$

where x is a random number between 0 and 1. The transfer event with the smallest $\tau$ happens first. After each event, the energy of every organic site was updated based on the electric field from the charges using:

$$E_i = E_{i0} - \int_{z_0}^{z_i} F(z) \cdot dz \qquad \text{Equation 9}$$

where $E_{i0}$ is the HOMO energy when F=0, $z_i$ is the distance of molecule i perpendicular to the interface, $z_0$ is the z-coordinate for a molecule in the bulk (taken at 10 nm from the interface), and F(z) is the electric field.

The electric field from the holes is given by:

$$F_{hole}(r_i) = \sum_j \frac{q}{4\pi\varepsilon_0\varepsilon_r |r_i - r_j|^2} \hat{r}_{ij} \qquad \text{Equation 10}$$

where $r_i$ is the coordinate of a site i, $r_j$ is the coordinate of a hole at j, $\hat{r}_{ij}$ is the relative coordinate between the hole and $r_i$, $\varepsilon_0$ is the vacuum permittivity, and $\varepsilon_r$ is the relative dielectric constant of the organic. To reduce the computational workload, a cutoff radius of 4 nm was set for calculating the electric field from holes. $F_{hole}(z)$ was calculated by taking average of the $F_{hole}(r_i)$ over all sites in a certain plane.

Due to the high conductivity ($\sigma \sim 10^{-2}$ S/m) and static dielectric constant ($\varepsilon \sim 18$) of $MoO_x$ compared to the organic blend (e.g. $\sigma \sim 10^{-6}$ S/m and $\varepsilon \sim 4$ for $C_{70}$), all the transferred electrons uniformly distributed at the $MoO_x$ surface. The electric field on the organic side was thus:

$$F_{electron}(z) = \frac{\sigma}{2\varepsilon_0\varepsilon_r} \qquad \text{Equation 11}$$

where $\sigma$ is the electron surface density. Due to energetic disorder in the organic thin film, holes diffused among molecules and distributed across a few interfacial molecular layers. The asymmetric distribution of electrons and holes resulted in an interface dipole, and hence the energy level shift observed in graph 606 of FIG. 6B. The electric potential φ in graph 608 and 609 was calculated using:

$$\varphi(z_i) = \int_{z_{bulk}}^{z_i} F(z) \cdot dz, \qquad \text{Equation 12}$$

where $z_{bulk}=10$ nm by assuming the electric field at 10 nm is zero.

Hole diffusion was also simulated using Equation 7 above, where $P_0$ is proportional to the overlap between the HOMOs of two neighboring molecules. Although the absolute values of $P_0$ have no effect on the simulation results, the charge transfer across the interface can be related to $P_0$ by introducing the parameter, $\alpha = P_{0diff}/P_{0trans}$, where $P_{0diff}$ is the maximum hopping rate for hole diffusion among organic molecules, and $P_{0trans}$ is the maximum hopping rate for charge transfer between the $MoO_x$ layer and the organic. Electrons in $MoO_x$ can transfer back into the organic to recombine with holes near the interface. Thermal equilibrium is reached when the electron transfer is balanced by electron-hole recombination across the interface. The holes in the organic layer can also diffuse among neighboring molecules. For either the recombination or diffusion event to happen, there is a wait time as shown in Equation 8. The $V_{int}$ in graph 608 and graph 609 was calculated with $\alpha=130$. The large value of $\alpha$ is due to the smaller overlap between the organic HOMOs and the electron wavefunctions in the $MoO_x$ CB compared with the overlap between organic HOMOs.

Figure 8:
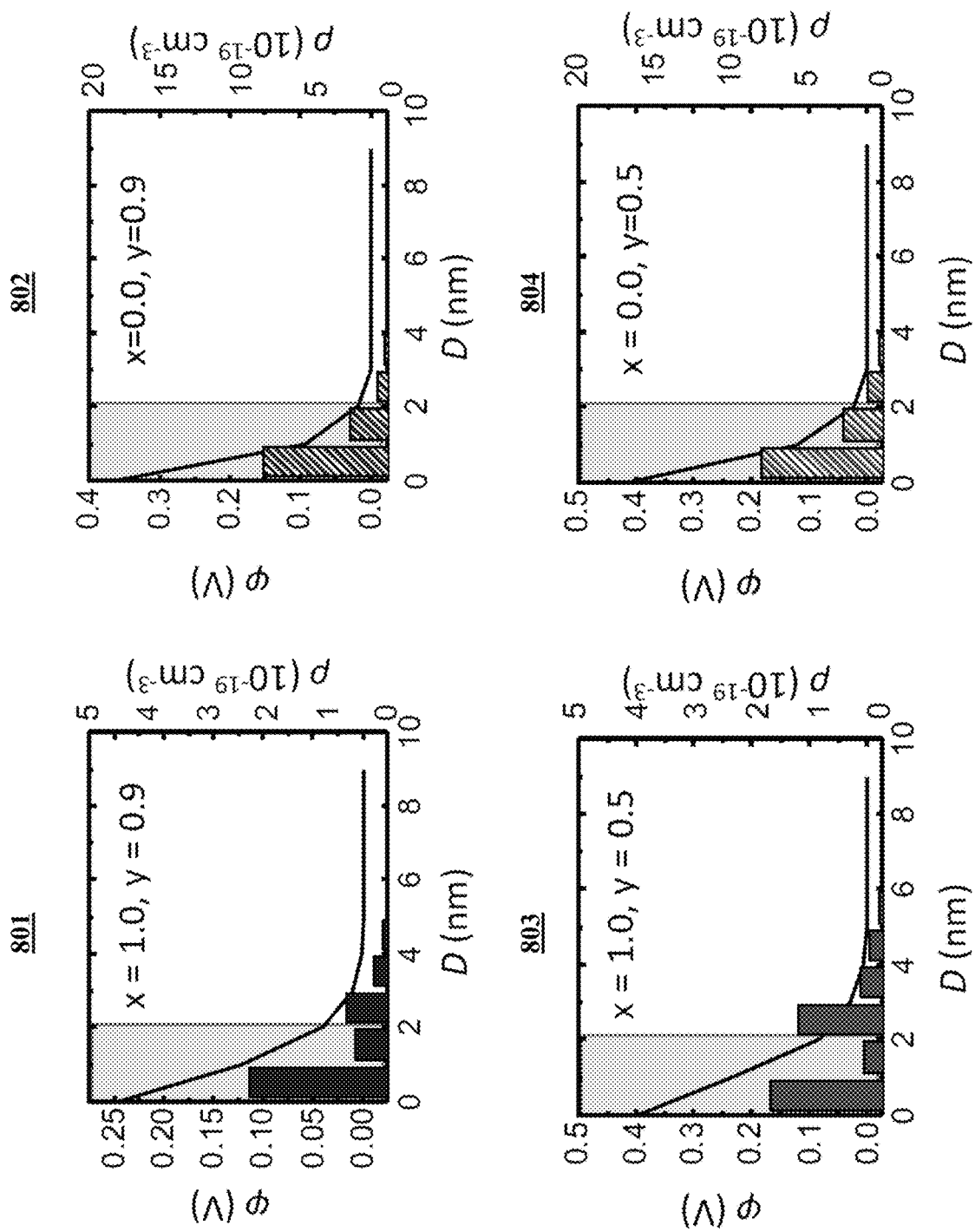
FIG. 8 is a set of graphs of simulated electric potential.

The graphs of FIG. 8 show the simulated electric potential relative to the bulk vacuum level, φ, and the hole concentration, ρ, in the BHJ vs. distance, D, from the $MoO_x$ interface for devices with different x and y. The shaded areas indicate the interface layer width. The interface potential drop is, then:

$$V_{int} = \varphi(D=0 \text{ nm}) - \varphi(D=10 \text{ nm}) \qquad \text{Equation 13}$$

When y=0.9, the device with x=1 (graph 801) has a lower concentration of holes at the $MoO_x$ interface compared with the device with x=0 (graph 802) since the $C_{70}$ HOMO is deeper than that of DBP. This results in a smaller surface dipole at thermal equilibrium, and an approximately 30% decrease in $V_{int}$ from 0.37 V to 0.25 V. Thus, the rigid voltage shift in the J-V characteristics is ΔV=0.12 V for y=0.9. The simulated $V_{int}$ of devices with y=0.9 and various x are shown in graph 602 (black diamonds). The change in Vint vs. x is quantitatively consistent with the change in Voc. For y=0.5, the device with x=1 (FIG. 803) also has a lower interface hole concentration compared with the device with x=0 (FIG. 804). However, a large fraction of holes distribute deep into the organic bulk due to the high concentration of DBP in the BHJ, leading to a larger average distance between the holes and electrons at the $MoO_x$ interface. As a result, $V_{int}$ of the device with x=1 (0.40 V) is similar to that of the device with x=0 (0.42 V), which also agrees with graph 607. The strong dependence of the voltage shift on J when y=0.3 in graph 607 suggests that the difference between the two devices is not only due to changes in $V_{int}$, but also has contributions from a hole injection barrier when y is small.

Discussion

The dependence of $V_{oc}$ on $C_{70}$ concentration in the AIL, x (FIG. 3(b)) and in the bulk, y (graph 602) reveals the different origins of the energy losses in the two active region sections. For y=90%, $V_{oc}$ and the simulated $V_{int}$ show similar monotonic dependences on x (see graph 606). This indicates that the energy loss at the active region/ABL interface is governed by $V_{int}$ as described above. However, the energy loss in the bulk layer was closely related to the CT state energy in the bulk, as suggested by the similar dependences on y of $V_{oc}$ and CT energy when x is fixed (see graph 604).

As shown in graph 605, both $J_D$ and $J_{ph}$ featured a rigid shift relative to the device voltage, V, depending on the composition of the AIL. When plotted with reference to $V_a$ in graph 606, the $J_{ph}$-$V_a$ relationships for the two devices were almost identical in the region of $J_{ph}<0$, showing that photogeneration in the BHJs was indeed governed by $V_a$ and was unaffected by $V_{int}$, in agreement with the simulations. Both devices showed $V_{oc}$ at $V_a=-0.10\pm0.01$ V, as denoted by the vertical dash line. The device with a $C_{70}$ AIL had a slightly higher $J_D$ at a given $V_a$, which was possibly due to a reduced hole injection barrier.

Holes traversed the AIL across thicknesses comparable to the sum of energy bending region thickness λ (30±10 Å as shown in FIG. 6G) plus the hole tunneling distance through the organic, which can be as large as 4 nm. As shown in FIG. 9, $V_{oc}$ increases with AIL thicknesses <5 nm, while $J_{sc}$ remains nearly unaffected. When the AIL thickness was 8 nm, however, it exceeded the tunneling length and thus acts as a hole-blocking layer, leading to distorted J-V characteristics with a reduced $J_{sc}$ and FF. At this point, charges must transfer across the barrier by thermionic emission, which was inherently dissipative. While this may appear as an increase in $V_{oc}$, it was accompanied by a decrease in $J_{ph}$ and fill factor, thus reducing the power conversion efficiency of the solar cell.

Besides AIL, the voltage shift also depends on $C_{70}$ concentration, y, in the bulk. As y changed from 90% to 50%, $\Delta V$ between devices with a $C_{70}$ and a DBP AIL dropped from 0.12±0.01 V to 0.02±0.01 V, as shown in graph 607 of FIG. 6C. When y=90%, $\rho_h$ near the interface was lower with a $C_{70}$ AIL compared with that with a DBP AIL, leading to a 30% drop in $V_{int}$ (0.37 V to 0.25 V), see graph 608 of FIG. 6D. When y=50%, the device with a $C_{70}$ AIL still has lower $\rho_h$ near the interface as shown in graph 609. But due to the higher DBP concentration in the bulk compared with the $C_{70}$ AIL, a portion of holes diffused into the bulk, resulting in a larger average electron-hole separation. As a result, $V_{int}$ for devices with a $C_{70}$ or DBP AIL were similar. When the bulk layer had only 30% $C_{70}$, the device J-V characteristics no longer showed a rigid horizontal shift and the shape changes from that of the devices with thinner AILs (black lines in graph 607), suggesting the formation of an energy barrier with impedance to charge extraction.

Similar rigid shift of the J-V characteristics were observed for devices with a PEDOT:PSS ABL with a voltage shift of 0.07±0.01 V, as shown in graph 610. This agrees with the energy bending observed at the $C_{70}$/PEDOT:PSS interface in FIG. 6G. No energy bending was observed at the $C_{70}$/HATCN interface. As a result, the AIL caused a drop in $V_{oc}$ and FF, as shown in graph 611. This suggests that the energy bending at the interface was responsible for hole transport across the AIL.

Apart from DBP/$C_{70}$, the effect of an acceptor AIL was also tested on two other D/A systems: 2-[(7-[4-[N,N-Bis(4-methylphenyl)amino]phenyl]-2,1,3-benzothiadiazol-4-yl)methylene] propanedinitrile (DTDCPB)/$C_{70}$ and 2-[[7-(5-N,N-Ditolylaminothiophen-2-yl)-2,1,3-benzothiadiazol-4-yl]methylene]malononitrile (DTDCTB)/$C_{60}$. Table 1 shows device characteristics of the three D/A material systems with and without the acceptor AIL. All three systems show improvement in $V_{oc}$ and PCE with an acceptor AIL.

Monte Carlo simulations showed that there is an interfacial energy loss of magnitude $qV_{int}$ at the organic/$MoO_x$ interface that can be as high as 0.4 eV. The interfacial energy loss can be varied over a range of 120 mV±10 by controlling the interface layer composition, independent of the short-circuit current ($J_{sc}$) and fill factor (FF). The existence of $V_{int}$ brought the $C_{70}$ HOMO near the interface close to that of DBP in the bulk, enabling hole transport through this interfacial zone. The $V_{int}$ was found to be directly related to the surface dipole created by the charge transfer between organic and $MoO_x$. The magnitude of the dipole was determined by the magnitude of the hole distribution in the organic, which is a function of the interface layer composition. The more $C_{70}$ in the interface layer, the smaller surface dipole and $V_{int}$, thus the higher $V_{oc}$. Therefore, a neat $C_{70}$ interface layer improved the OPV performance. FIG. 9 shows that Voc increases for DBP/$C_{70}$ devices with neat $C_{70}$ interface layer thickness. However, the J-V characteristic assumes an approximately S-shape for thicknesses >5 nm, resulting in a drop in both Jsc and FF. When the $C_{70}$ interface layer thickness exceeds $\lambda$, the $C_{70}$ acts as a hole-blocking layer. Also demonstrated above is the generality of this effect—inserting 3-nm-thick neat acceptor interface layers in devices with BHJs of different compositions than the DBP: $C_{70}$ system discussed above. The device characteristics are summarized in Table 2 below. In all cases, there was an increase in $V_{oc}$ and PCE when a neat acceptor interface layer was inserted between the active region and the anode buffer compared with structures lacking this layer.

TABLE 2

| Device Active Layer | $J_{sc}$ [mA/cm²] | $V_{oc}$ [V][b] | FF[b] | PCE [%] |
|---|---|---|---|---|
| DBP/$C_{70}$ (1:2, 54 nm) | 11.3 ± 0.2 | 0.86 | 0.50 | 4.9 ± 0.1 |
| DBP/$C_{70}$ (1:2, 54 nm) * | 11.5 ± 0.2 | 0.88 | 0.51 | 5.2 ± 0.1 |
| DBP/$C_{70}$ (1:4, 60 nm) | 12.6 ± 0.2 | 0.86 | 0.54 | 5.8 ± 0.1 |
| DBP/$C_{70}$ (1:4, 60 nm) * | 12.6 ± 0.2 | 0.88 | 0.54 | 5.9 ± 0.1 |
| DTDCPB/$C_{70}$ (1:1, 80 nm) | 14.4 ± 0.2 | 0.92 | 0.67 | 8.8 ± 0.2 |
| DTDCPB/$C_{70}$ (1:1, 80 nm) * | 14.4 ± 0.2 | 0.94 | 0.67 | 9.0 ± 0.2 |
| DTDCPB/$C_{70}$ (1:2, 80 nm) | 13.9 ± 0.2 | 0.90 | 0.70 | 9.2 ± 0.2 |
| DTDCPB/$C_{70}$ (1:2, 80 nm) * | 14.1 ± 0.2 | 0.94 | 0.71 | 9.8 ± 0.2 |
| DTDCPB/$C_{70}$ (1:3, 80 nm) | 13.7 ± 0.2 | 0.88 | 0.72 | 8.7 ± 0.2 |
| DTDCPB/$C_{70}$ (1:3, 80 nm) * | 13.6 ± 0.2 | 0.94 | 0.70 | 9.0 ± 0.2 |
| DTDCTB/$C_{60}$ (1:3, 80 nm) | 10.4 ± 0.3 | 0.80 | 0.47 | 3.9 ± 0.2 |
| DTDCTB/$C_{60}$ (1:3, 80 nm) * | 10.6 ± 0.3 | 0.84 | 0.46 | 4.1 ± 0.2 |

As with the values in Table 1, the devices having a * included a 3-nm thick neat acceptor interface layer. Errors in $V_{oc}$ and FF are ±0.01.

CONCLUSIONS

The above experimental examples have shown that a static dipole at the active region/ABL interface introduces energy loss. By removing the donors near the active region/ABL interface, the loss can be reduced by up to 30%. A change in interfacial energy loss results in a concomitant change in $V_{oc}$, while $J_{sc}$ and FF remain unaffected. The $V_{oc}$ can be controlled over a range of 120±10 meV by varying the D/A ratio near the interface. The change in $V_{oc}$ was attributed to the change in the potential drop across the interface dipole layer at various interfacial D/A ratios, which was supported by Monte Carlo simulations. A significant outcome is the demonstration of a counterintuitive but effective strategy to reduce energy loss by inserting a thin electron accepting layer between the active region and the anode buffer. A primary condition for this layer is that it must be sufficiently thin to support non-dissipative charge tunneling, resulting in an increase in $V_{oc}$ without a decrease in current or fill factor.

The above experimental examples illuminate the different roles played by the interface and bulk layers in the photo-generation process, showing that their compositions should be independently controlled to optimize OPV performance. It also demonstrates that acceptors can transport holes and reduce the energy loss for hole extraction in OPVs with the help of an interface dipole layer.

REFERENCES

The following publications are incorporated herein by reference in their entireties:

Y. Lin, Y. Li and X. Zhan, Small molecule semiconductors for high-efficiency organic photovoltaics, Chem. Soc. Rev. 41, 4245 (2012).

A. Mishra and P. Bäuerle, Small molecule organic semiconductors on the move: Promises for future solar energy technology, Angew. Chem. Int. Ed. 51, 2020 (2012).

Y. Cui, H. Yao, J. Zhang, T. Zhang, Y. Wang, L. Hong, K. Xian, B. Xu, S. Zhang, J. Peng, Z. Wei, F. Gao and J. Hou, Over 16% efficiency organic photovoltaic cells enabled by a chlorinated acceptor with increased open-circuit voltages, Nat. Commun. 10, 2515 (2019).

H. Bässler, Charge transport in disordered organic photo-conductors a monte carlo simulation study, Phys. Status Solidi 175, 15 (1993).

Y. L. Lin, M. A. Fusella and B. P. Rand, The impact of local morphology on organic donor/acceptor charge transfer states, Adv. Energy Mater. 8, 1702816 (2018).

T. Linderl, T. Zechel, M. Brendel, D. Moseguí González, P. Müller-Buschbaum, J. Pflaum and W. Brütting, Energy losses in small-molecule organic photovoltaics, Adv. Energy Mater. 7, 1700237 (2017).

X. Liu, K. Ding, A. Panda and S. R. Forrest, Charge transfer states in dilute donor—acceptor blend organic heterojunctions, ACS Nano 10, 7619 (2016).

K. Ding, X. Liu and S. R. Forrest, Charge transfer and collection in dilute organic donor—acceptor heterojunction blends, Nano Lett. 18, 3180 (2018).

Z. Guan, H.-W. Li, Y. Cheng, Q. Yang, M.-F. Lo, T.-W. Ng, S.-W. Tsang and C.-S. Lee, Charge-transfer state energy and its relationship with open-circuit voltage in an organic photovoltaic device, J. Phys. Chem. C 120, 14059 (2016).

X. Liu, B. P. Rand and S. R. Forrest, Engineering charge-transfer states for efficient, low-energy-loss organic photovoltaics, Trends in Chemistry 1, 815 (2019).

J. Meyer, S. Hamwi, M. Kroger, W. Kowalsky, T. Riedl and A. Kahn, Transition metal oxides for organic electronics: Energetics, device physics and applications, Adv. Mater. 24, 5408 (2012).

D. Y. Kim, J. Subbiah, G. Sarasqueta, F. So, H. Ding, Irfan and Y. Gao, The effect of molybdenum oxide interlayer on organic photovoltaic cells, Appl. Phys. Lett. 95, 093304 (2009).

M. Kröger, S. Hamwi, J. Meyer, T. Riedl, W. Kowalsky and A. Kahn, Role of the deep-lying electronic states of moo3 in the enhancement of hole-injection in organic thin films, Appl. Phys. Lett. 95, 123301 (2009).

M. Oehzelt, N. Koch and G. Heimel, Organic semiconductor density of states controls the energy level alignment at electrode interfaces, Nat. Commun. 5, 4174 (2014).

C. Wang, I. Irfan, X. Liu and Y. Gao, Role of molybdenum oxide for organic electronics: Surface analytical studies, J. Vac. Sci. Technol. 32, 040801 (2014).

J. Wang, L. Xu, Y.-J. Lee, M. De Anda Villa, A. V. Malko and J. W. P. Hsu, Effects of contact-induced doping on the behaviors of organic photovoltaic devices, Nano Lett. 15, 7627 (2015).

N. B. Kotadiya, H. Lu, A. Mondal, Y. Ie, D. Andrienko, P. W. M. Blom and G.-J. A. H. Wetzelaer, Universal strategy for ohmic hole injection into organic semiconductors with high ionization energies, Nat. Mater. 17, 329 (2018).

M. A. Baldo and S. R. Forrest, Interface-limited injection in amorphous organic semiconductors, Phys. Rev. B 64, 085201 (2001).

B. N. Limketkai and M. A. Baldo, Charge injection into cathode-doped amorphous organic semiconductors, Phys. Rev. B 71, 085207 (2005).

A. Melianas, V. Pranculis, D. Spoltore, J. Benduhn, O. Inganas, V. Gulbinas, K. Vandewal and M. Kemerink, Charge transport in pure and mixed phases in organic solar cells, Adv. Energy Mater. 7, 1700888 (2017).

P. K. Watkins, A. B. Walker and G. L. B. Verschoor, Dynamical monte carlo modelling of organic solar cells: The dependence of internal quantum efficiency on morphology, Nano Lett. 5, 1814 (2005).

U. Wolf, V. I. Arkhipov and H. Bässler, Current injection from a metal to a disordered hopping system. I. Monte carlo simulation, Phys. Rev. B 59, 7507 (1999).

Y. N. Gartstein and E. M. Conwell, Field-dependent thermal injection into a disordered molecular insulator, Chem. Phys. Lett. 255, 93 (1996).

J.-P. Yang, W.-Q. Wang, L.-W. Cheng, Y.-Q. Li, J.-X. Tang, S. Kera, N. Ueno and X.-h. Zeng, Mechanism for doping induced p type c60 using thermally evaporated molybdenum trioxide (moo3) as a dopant, J. Phys. Condens. Matter 28, 185502 (2016).

Irfan, M. Zhang, H. Ding, C. W. Tang and Y. Gao, Strong interface p-doping and band bending in c60 on moox, Org. Electron. 12, 1588 (2011).

J. Yoo, K. Jung, J. Jeong, G. Hyun, H. Lee and Y. Yi, Energy level alignment at c60/dtdctb/pedot:Pss interfaces in organic photovoltaics, Appl. Surf. Sci. 402, 41 (2017).

K. Sotthewes, R. van Bremen, E. Dollekamp, T. Boulogne, K. Nowakowski, D. Kas, H. J. W. Zandvliet and P. Bampoulis, Universal fermi-level pinning in transition-metal dichalcogenides, J. Phys. Chem. C 123, 5411 (2019).

M. T. Greiner, M. G. Helander, W.-M. Tang, Z.-B. Wang, J. Qiu and Z.-H. Lu, Universal energy-level alignment of molecules on metal oxides, Nat. Mater. 11, 76 (2011).

W. Tress, in Organic solar cells: Theory, experiment, and device simulation, edited by W. Tress (Springer International Publishing, Cham, 2014), pp. 315.

J. Yun, W. Jang, T. Lee, Y. Lee and A. Soon, Aligning the band structures of polymorphic molybdenum oxides and organic emitters in light-emitting diodes, Phys. Rev. Appl. 7, 024025 (2017).

Y. Guo and J. Robertson, Origin of the high work function and high conductivity of moo3, Appl. Phys. Lett. 105, 222110 (2014).

K. Inzani, T. Grande, F. Vullum-Bruer and S. M. Selbach, A van der waals density functional study of moo3 and its oxygen vacancies, J. Phys. Chem. C 120, 8959 (2016).

D. O. Scanlon, G. W. Watson, D. J. Payne, G. R. Atkinson, R. G. Egdell and D. S. L. Law, Theoretical and experimental study of the electronic structures of moo3 and moo2, J. Phys. Chem. C 114, 4636 (2010).

S. Krishnakumar and C. S. Menon, Electrical and optical properties of molybdenum trioxide thin films, Bull. Mater. Sci. 16, 187 (1993).

S. K. Deb and J. A. Chopoorian, Optical properties and color☐center formation in thin films of molybdenum trioxide, J. Appl. Phys. 37, 4818 (1966).

L. Firlej, A. Zahab, F. Brocard and P. Bernier, Electric conductivity in c70 thin films, Synth. Met. 70, 1373 (1995).

S. L. Ren, K. A. Wang, P. Zhou, Y. Wang, A. M. Rao, M. S. Meier, J. P. Selegue and P. C. Eklund, Dielectric function of solid c70 films, Appl. Phys. Lett. 61, 124 (1992).

C. Battaglia, X. Yin, M. Zheng, I. D. Sharp, T. Chen, S. McDonnell, A. Azcatl, C. Carraro, B. Ma, R. Maboudian, R. M. Wallace and A. Javey, Hole selective moox contact for silicon solar cells, Nano Lett. 14, 967 (2014).

H. Ding, H. Lin, B. Sadigh, F. Zhou, V. Ozoling and M. Asta, Computational investigation of electron small polarons in α-moo3, J. Phys. Chem. C 118, 15565 (2014).

K. Ding, S. Forrest, Reducing Energy Losses at the Organic—anode-buffer Interface of Organic Photovoltaics, Phys. Rev. Appl. 13, 054046 (2020).

The disclosures of each and every patent, patent application, and publication cited herein are hereby incorporated herein by reference in their entirety. While this disclosure has been disclosed with reference to specific embodiments, it is apparent that other embodiments and variations of this disclosure may be devised by others skilled in the art without departing from the true spirit and scope of the disclosure. The appended claims are intended to be construed to include all such embodiments and equivalent variations.

What is claimed is:

1. An organic photovoltaic device, comprising:
    an anode and a cathode;
    a first active layer positioned between the anode and the cathode, comprising a mix of a first donor material and a first acceptor material in a first ratio;
    a second active layer adjacent to the first active layer, comprising a mix of a second donor material and a second acceptor material in a second ratio, wherein the second active layer differs from the first active layer in at least one of donor material, acceptor material or ratio between the donor and acceptor materials; and
    an interface layer having a thickness of between 1 nm and 10 nm, positioned in direct contact with the anode and the first active layer, consisting of a third acceptor material, wherein the third acceptor material is a non-fullerene acceptor material.

2. The organic photovoltaic device of claim 1, wherein at least one of the first and second donor materials comprises DBP.

3. The organic photovoltaic device of claim 1, wherein at least one of the first and second acceptor materials comprises fullerene.

4. The organic photovoltaic device of claim 3, wherein the fullerene comprises $C_{70}$.

5. The organic photovoltaic device of claim 1, wherein the volumetric ratio of the first donor material to the first acceptor material in the first active layer is between 1:4 and 1:10.

6. The organic photovoltaic device of claim 1, further comprising an exciton blocking/electron transport layer positioned between the cathode and the active layer.

7. The device of claim 1, wherein the interface layer has a HOMO energy 0.4 eV to 0.5 eV higher than a HOMO energy of the first active layer.

8. The device of claim 1, wherein the first active layer comprises multiple donor materials, multiple acceptor materials, or a combination of multiple donor materials and multiple acceptor materials.

9. The device of claim 1, wherein the second active layer comprises multiple donor materials, multiple acceptor materials, or a combination of multiple donor materials and multiple acceptor materials.

10. The organic photovoltaic device of claim 1, wherein at least one of the first and second acceptor materials comprises BT-IC.

11. The organic photovoltaic device of claim 1, wherein at least one of the first and second acceptor materials comprises BT-CIC.

12. The organic photovoltaic device of claim 1, wherein at least one of the first and second acceptor materials comprises TT-FIC.

13. The organic photovoltaic device of claim 1, wherein at least one of the first and second donor materials comprises CuPc, ClAlPc, SnPc, ZnPc, SubPc, naphthalocyanines, merocyanine dyes, BODIPY dyes, DIP, SQ dyes, DBP, DTDCTB, DTDCPB, iBuBTDC, DTDCPP, PCE-10, DPSQ, DTDCPB, iBuBTDC, DTDCPP, or PCE-10.

14. An organic photovoltaic device, comprising:
    an anode and a cathode;
    an active layer positioned between the anode and the cathode, comprising a mix of a first donor material and a first acceptor material in a first ratio;
    an interface layer having a thickness of between 1 nm and 10 nm, between the anode and the active layer, consisting of a non-fullerene acceptor material;
    an anode buffer layer positioned between the anode and the interface layer, and
    a second active layer adjacent to the first active layer, wherein the second active layer differs from the first active layer in at least one of donor material, acceptor material or ratio between the donor and acceptor materials;
    wherein the first acceptor material comprises fullerene.

15. The device of claim 14, wherein the anode buffer layer comprises PEDTO:PSS, HAT-CN, or $MoO_3$, and wherein the anode buffer layer has a thickness of 1 nm to 100 nm.

* * * * *